United States Patent [19]
Liron

[11] Patent Number: 6,147,904
[45] Date of Patent: Nov. 14, 2000

[54] REDUNDANCY METHOD AND STRUCTURE FOR 2-BIT NON-VOLATILE MEMORY CELLS

[75] Inventor: Eran Liron, Palo Alto, Calif.

[73] Assignee: Tower Semiconductor Ltd., Migdal Haemek, Israel

[21] Appl. No.: 09/243,974

[22] Filed: Feb. 4, 1999

[51] Int. Cl.⁷ ................................................ G11C 16/06
[52] U.S. Cl. .............................. 365/185.09; 365/185.03; 365/200
[58] Field of Search ............................. 365/185.09, 200, 365/185.03

[56] References Cited

U.S. PATENT DOCUMENTS

| | | | |
|---|---|---|---|
| 5,590,075 | 12/1996 | Mazzali | 365/185.22 |
| 5,604,702 | 2/1997 | Tailliet | 365/200 |
| 5,768,102 | 6/1998 | Eitan . | |
| 5,898,197 | 4/1999 | Fujiwara | 365/185.26 |
| 5,905,673 | 5/1999 | Khan | 365/185.03 |
| 5,909,390 | 6/1999 | Harari | 365/185.03 |

*Primary Examiner*—Richard Elms
*Assistant Examiner*—Tuan T. Nguyen
*Attorney, Agent, or Firm*—Bever, Hoffman & Harms, LLP; Patrick T. Bever

[57] ABSTRACT

A redundancy method and structure for 2-bit non-volatile memory cells formed in a memory array. The 2-bit memory transistors are arranged to form bit locations, each bit location including eight charge trapping regions. An initial charge trapping region is addressed during program (write) and read operations directed to the bit location, with seven redundant charge trapping regions being maintained in an erased state. At a predefined time, such as when operation of the initial charge trapping region declines due to repeated use, one of the redundant charge trapping regions replaces the initial charge trapping region, and is addressed during program (write) and read operations directed to the bit location. Redundancy data is stored in a supplemental non-volatile memory location of the memory array. The redundancy data identifies a currently-used charge trapping region of a bit location, and instructs addressing circuitry to store bit data addressed to that bit location in the currently-used charge trapping region. After a charge trapping region performance is used (i.e., when performance declines), the redundancy data is updated such that bit data addressed to the bit location is stored in another (redundant) charge trapping region assigned to the bit location.

15 Claims, 17 Drawing Sheets

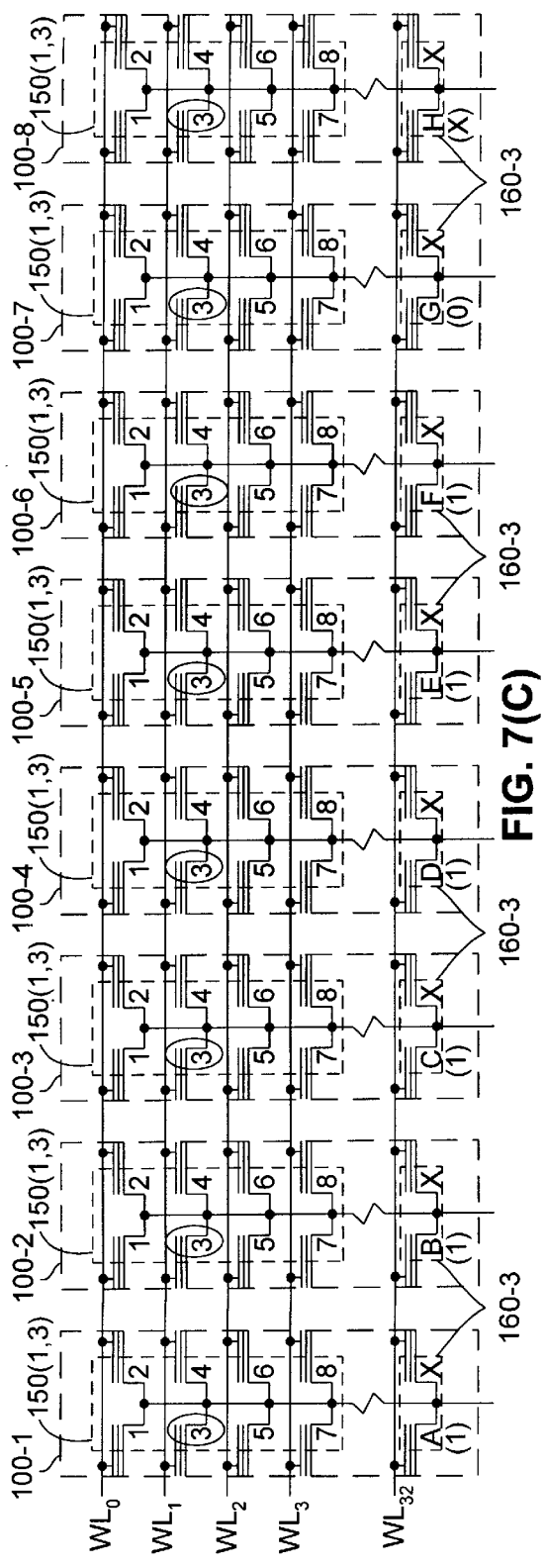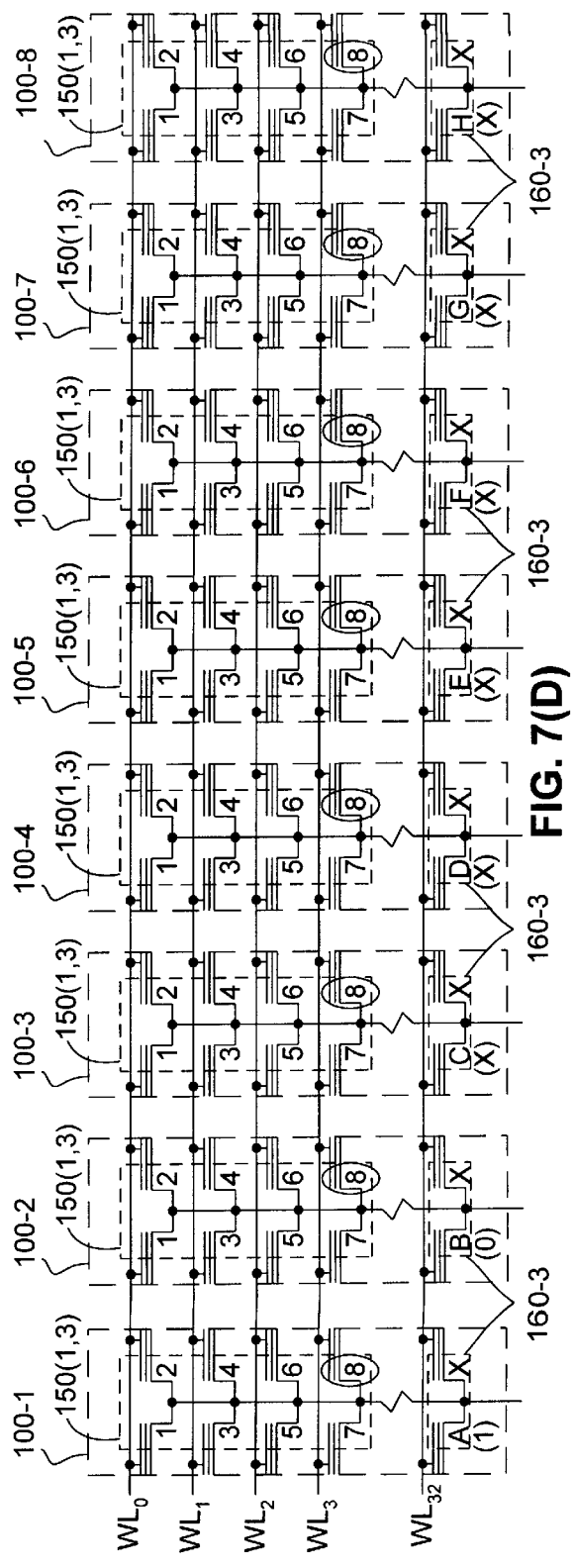

REDUNDANCY METHOD AND STRUCTURE FOR 2-BIT NON-VOLATILE MEMORY CELLS

FIELD OF THE INVENTION

The present invention relates to non-volatile memory cells. More specifically, the present invention relates to a redundancy method and structure for 2-bit non-volatile memory cells.

RELATED ART

FIG. 1 is a cross sectional view of a conventional 1-bit non-volatile semiconductor memory cell 10 that utilizes asymmetrical charge trapping. 1-bit memory cell 10, which is fabricated in p-type substrate 12, includes n+ source region 14, n+ drain region 16, channel region 17, silicon oxide layer 18, silicon nitride layer 20, silicon oxide layer 22, and control gate 24. Oxide layer 18, nitride layer 20 and oxide layer 22 are collectively referred to as ONO layer 21. Memory cell 10 operates as follows. A programming operation is performed by connecting source region 14 to ground, connecting drain region 16 to a programming voltage of about 9 Volts, and connecting control gate 24 to a voltage of about 10 Volts. As a result, electrons are accelerated from source region 14 to drain region 16. Near drain region 16, some electrons gain sufficient energy to pass through oxide layer 18 and be trapped in nitride layer 20 in accordance with a phenomenon known as hot electron injection. Because nitride layer 20 is non-conductive, the injected charge remains localized within charge trapping region 26 in nitride layer 20.

Memory cell 10 is read by applying 0 Volts to the drain region 16, 2 Volts to the source region 14, and 3 volts to the gate electrode. If charge is stored in charge trapping region 26 (i.e., memory cell 10 is programmed), then memory cell does not conduct current under these conditions. If there is no charge stored in charge trapping region 26 (i.e., memory cell 10 is erased), then memory cell 10 conducts current under these conditions. The current, or lack of current, is sensed by a sense amplifier to determine the state of memory cell 10.

Note that the polarity of the voltage applied across source region 14 and drain region 16 is reversed during the program and read operations. That is, memory cell 10 is programmed in one direction (with source region 14 grounded), and read the opposite direction (with drain region 16 grounded). As a result, the read operation is referred to as a reverse read operation. Memory cell 10 is described in more detail in U.S. Pat. No. 5,768,192.

Memory cell 10 can also be controlled to operate as a 2-bit non-volatile semiconductor memory cell. To accomplish this, memory cell 10 is controlled to use a second charge trapping region in nitride layer 20, which is located adjacent to source region 14. FIG. 2 illustrates both the first charge trapping region 26 (described above in connection with FIG. 1), and the second charge trapping region 28 in dashed lines. The second charge trapping region 28 is used to store a charge representative of a second bit. The second charge trapping region 28 is programmed and read in a manner similar to the first charge trapping region 26. More specifically, the second charge trapping region 28 is programmed and read by exchanging the source and drain voltages described above for programming and reading the first charge trapping region 26. Thus, the second charge trapping region 28 is programmed by applying 0 Volts to drain region 16, applying 9 Volts to source region 14 and applying 10 Volts to control gate 24. Similarly, the second charge trapping region 28 is read by applying 0 Volts to source region 14, 2 Volts to drain region 16, and 3 Volts to control gate 24.

Note that because nitride layer 20 is non-conductive, the charges stored in the first and second charge trapping regions 26 and 28 remain localized within nitride layer 20. Also note that the state of the first charge trapping region 26 does not interfere with the reading of the charge stored in the second charge trapping region 28 (and vice versa). Thus, if the first charge trapping region 26 is programmed (i.e., stores charge) and the second charge trapping region 28 is not programmed (i.e., does not store charge), then a reverse read of the first charge trapping region will not result in significant current flow. However, a reverse read of the second bit will result in significant current flow because the high voltage applied to drain region 16 will result in punch through in the channel region adjacent to first charge trapping region 26. Thus, the information stored in the first and second charge trapping regions 26 and 28 is read properly.

Similarly, if both the first and second charge trapping regions are programmed, neither reverse read operation results in significant current flow. Finally, if neither the first charge trapping region 26 nor the second charge trapping region 28 is programmed, then both reverse read operations result in significant current flow.

As is typical with flash and EEPROM memory cells, repeated use causes memory cell 10 to lose its ability to store charges during the programming process. It would therefore be desirable to have a redundancy method that extends the useful life of a flash memory array such that it is greater than the useful life of one memory cell 10. For purposes of this disclosure, a flash memory array is defined as a non-volatile memory array that cannot be erased on a byte-by-byte basis, but which must be erased in blocks. This is in contrast to an EEPROM array, which is defined as a non-volatile memory array that can be erased on a byte-by-byte basis. It would further be desirable if the redundancy method were utilized in an EEPROM array such that the useful life of the EEPROM array is greater than the useful life of one memory cell 10.

SUMMARY

Accordingly, the present invention provides structures and redundancy methods for memory arrays (flash and EEPROM) that incorporate 2-bit non-volatile memory transistors. The 2-bit memory transistors are arranged to form bit locations, each bit location including a plurality of charge trapping regions (an initial charge trapping region and one or more redundant charge trapping regions). The initial charge trapping region is addressed during program (write) and read operations directed to the bit location, with the redundant charge trapping regions being maintained in an erased state. At a predefined time, such as when operation of the initial charge trapping region declines due to repeated use, one of the redundant charge trapping regions replaces the initial charge trapping region, and is addressed during program (write) and read operations directed to the bit location. This process of replacing used charge trapping regions with unused redundant charge trapping regions is repeated until all of the redundant charge trapping regions associated with the bit location are used. This redundancy method significantly extends the operating life of the memory array.

In accordance with a first aspect of the present invention, each charge trapping region is used until its operating performance declines (e.g., it wears out). The declining operating performance of a charge trapping region is determined by comparing an actual performance parameter of the charge trapping region with a predefined performance parameter. In one embodiment, the predefined performance parameter is a minimum erasing time, which is compared with the actual time required to remove a charge from the charge trapping region. When the actual erasing period is greater than the predefined minimum erasing period, the redundancy data is altered to address one of the redundant charge trapping regions. In another embodiment, the predefined performance parameter is a minimum programming period associated with the time required to store a charge in the charge trapping region. With repeated use, the actual programming time increases until the charge trapping region fails. When the actual programming time exceeds the predefined minimum programming time, the redundancy data is altered to address one of the redundant charge trapping regions. In yet another embodiment, the actual number of programming/erasing cycles of the charge trapping region are compared with a predefined number (e.g., 10,000), and the redundancy data is altered to address one of the redundant charge trapping regions when the actual number of cycles exceeds the predefined number.

In accordance with a second aspect of the present invention, redundancy data is stored in a supplemental non-volatile memory location of the memory array. The redundancy data identifies a currently-used charge trapping region of a bit location. The redundancy data is used by addressing circuitry to store bit data addressed to that bit location in the currently-used charge trapping region. After a charge trapping region performance is used (i.e., when performance declines), the redundancy data is updated such that bit data addressed to the bit location is stored in another (redundant) charge trapping region assigned to the bit location. In one embodiment, the supplemental memory location includes a plurality of supplemental charge trapping regions that remain erased when the initial charge trapping region of the bit location is used. When performance of the initial charge trapping region declines, a first supplemental charge trapping region is programmed. Subsequently, when the bit location is addressed, the programmed supplemental charge trapping region notifies the addressing circuitry of the memory array to store/read bit information to/from a first one of the redundant charge trapping regions assigned to the bit location. Subsequent decline of the first redundant charge trapping region results in the programming of a second supplemental charge trapping region, so that the addressing circuitry directs bit data to a second one of the redundant charge trapping regions assigned to the bit location. In this manner, each of the redundant charge trapping regions is addressed when its corresponding supplemental charge trapping region is programmed. By addressing the initial/redundant charge trapping regions in this manner, it is possible to implement the redundancy data by adding a supplemental word line to the columns (e.g., bit lines) of the bit location, thereby simplifying the addressing process and minimizing the area used to store redundancy data.

These and other aspects of the present invention will be more fully understood in view of the following description and drawings.

BRIEF DESCRIPTION OF THE DRAWINGS

FIGS. 7(A), 7(B), 7(C) and 7(D) are partial schematic diagrams showing how redundancy data is stored and used to address specific charge trapping regions in a memory array in accordance with an embodiment of the present invention.

DETAILED DESCRIPTION

Memory Cell Operation

Figure 1:
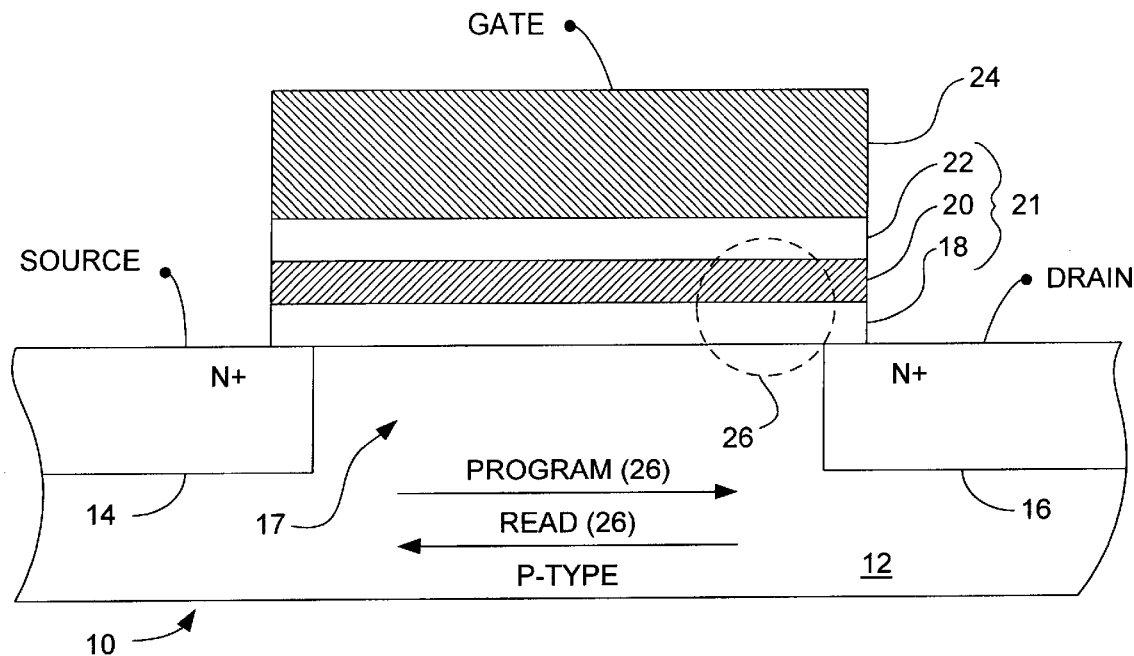
FIG. 1 is a cross sectional diagram illustrating a conventional 1-bit non-volatile memory cell.
Figure 2:
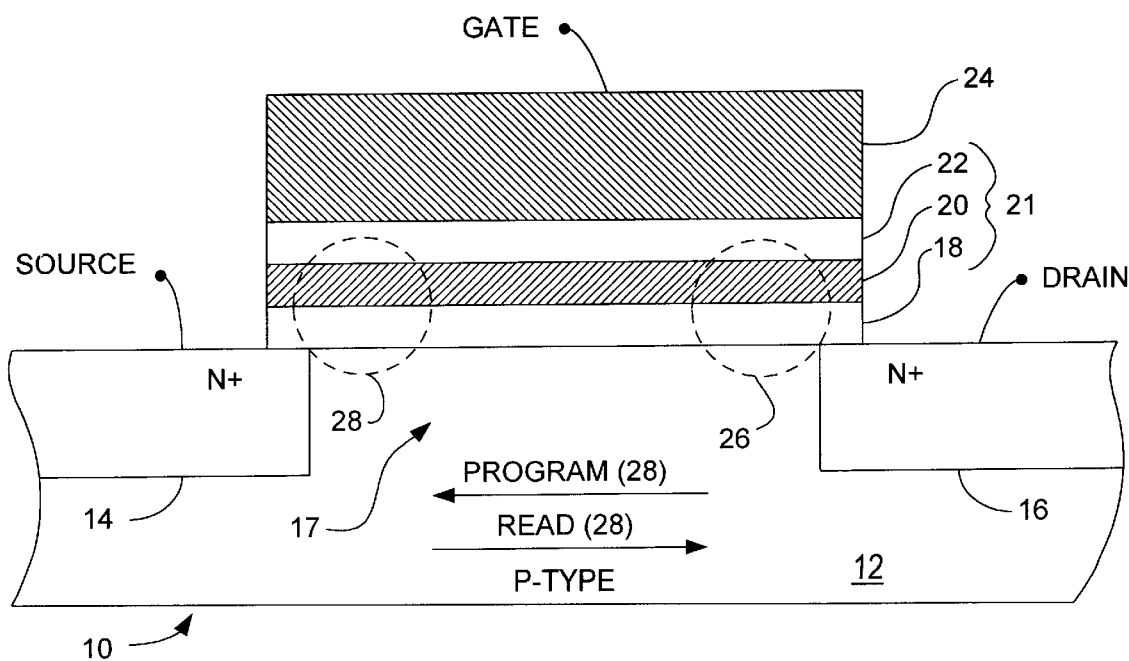
FIG. 2 is a cross sectional diagram illustrating a conventional 2-bit non-volatile memory cell.
Figure 3:
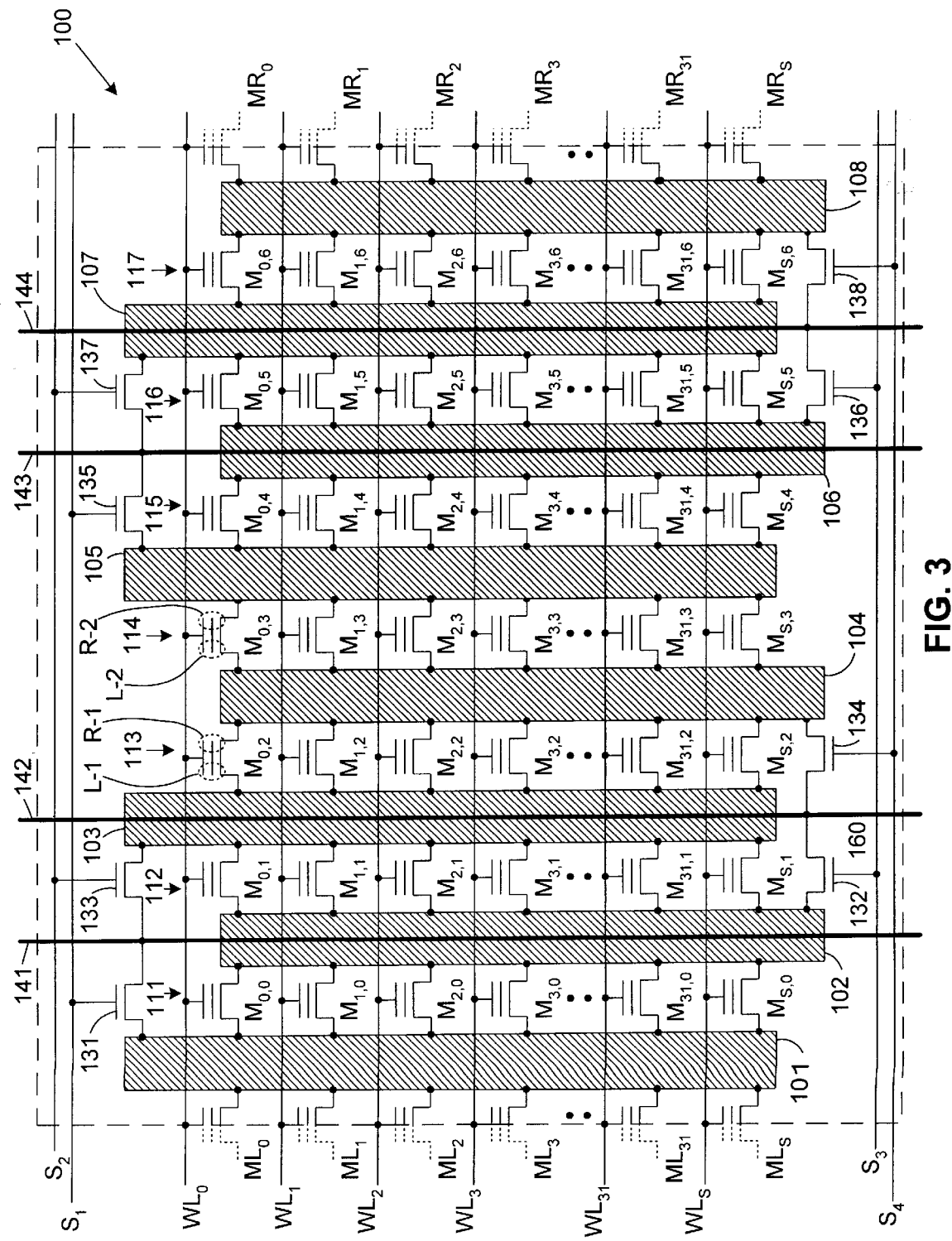
FIG. 3 is a schematic diagram illustrating a memory block that uses the 2-bit memory cells of FIG. 2 in accordance with a first embodiment of the present invention.

FIG. 3 is a schematic diagram illustrating a memory block 100 that uses a plurality of 2-bit memory cells identical to 2-bit memory cell 10 (FIG. 2). Memory block 100 includes seven full columns of memory cells, two columns of memory cells that are shared with adjacent memory blocks, and, in this example, thirty-two rows of memory cells. The rows extend along a first axis, and the columns extend along a second axis, perpendicular to the first axis. The memory cells in the seven full columns are identified as memory cells $M_{X,Y}$, where X and Y represent the row and column locations, respectively, of the memory cells within memory block 100. The shared memory cells on the left border of memory block 100 are identified as memory cells $ML_X$, and the shared memory cells on the right border of memory block 100 are identified as memory cells $MR_X$. Thus, memory block includes memory cells $M_{0,0}$–$M_{31,6}$ and shared memory cells $ML_0$–$ML_{31}$ and $MR_0$–$MR_{31}$.

As discussed in greater detail below, in addition to the memory cells $M_{0,0}$–$M_{31,6}$ and shared memory cells $ML_0$–$ML_{31}$ and $MR_0$–$MR_{31}$, memory block 100 also includes one row of supplemental memory cells $M_{S,0}$–$M_{S,6}$ and shared memory cells $ML_S$ and $MR_S$ that are used to store redundancy data.

Each of the memory cells includes two charge trapping regions, namely, a left charge trapping region and a right charge trapping region. The charge trapping regions of memory cell $M_{0,2}$ are labeled as left charge trapping region L-1 and right charge trapping region R-1. Similarly, the charge trapping regions of memory cell $M_{0,3}$ are labeled as left charge trapping region L-2 and right charge trapping region R-2.

The source and drain regions of memory cells $M_{0,0}$–$M_{31,6}$ and $M_{S,0}$–$M_{S,6}$ are formed by diffused regions 101–108, which extend in parallel along the second axis. As described in more detail below, diffused regions 101–108 also operate as bit lines within memory block 100. Consequently, diffused regions 101–108 are hereinafter referred to as diffusion bit lines.

ONO structures 111–117 are located between adjacent diffusion bit lines 101–108. For example, ONO structure 111 is located between diffusion bit lines 101 and 102. The gates of the memory cells in each row are commonly connected to a word line. More specifically, the memory cells of each row are connected to an associated one of word lines $WL_0$–$WL_{31}$, and the supplement memory cells $M_{S,0}$–$M_{S,6}$, $ML_S$ and $MR_S$ are connected to supplemental word line $WL_S$.

Figure 4A:
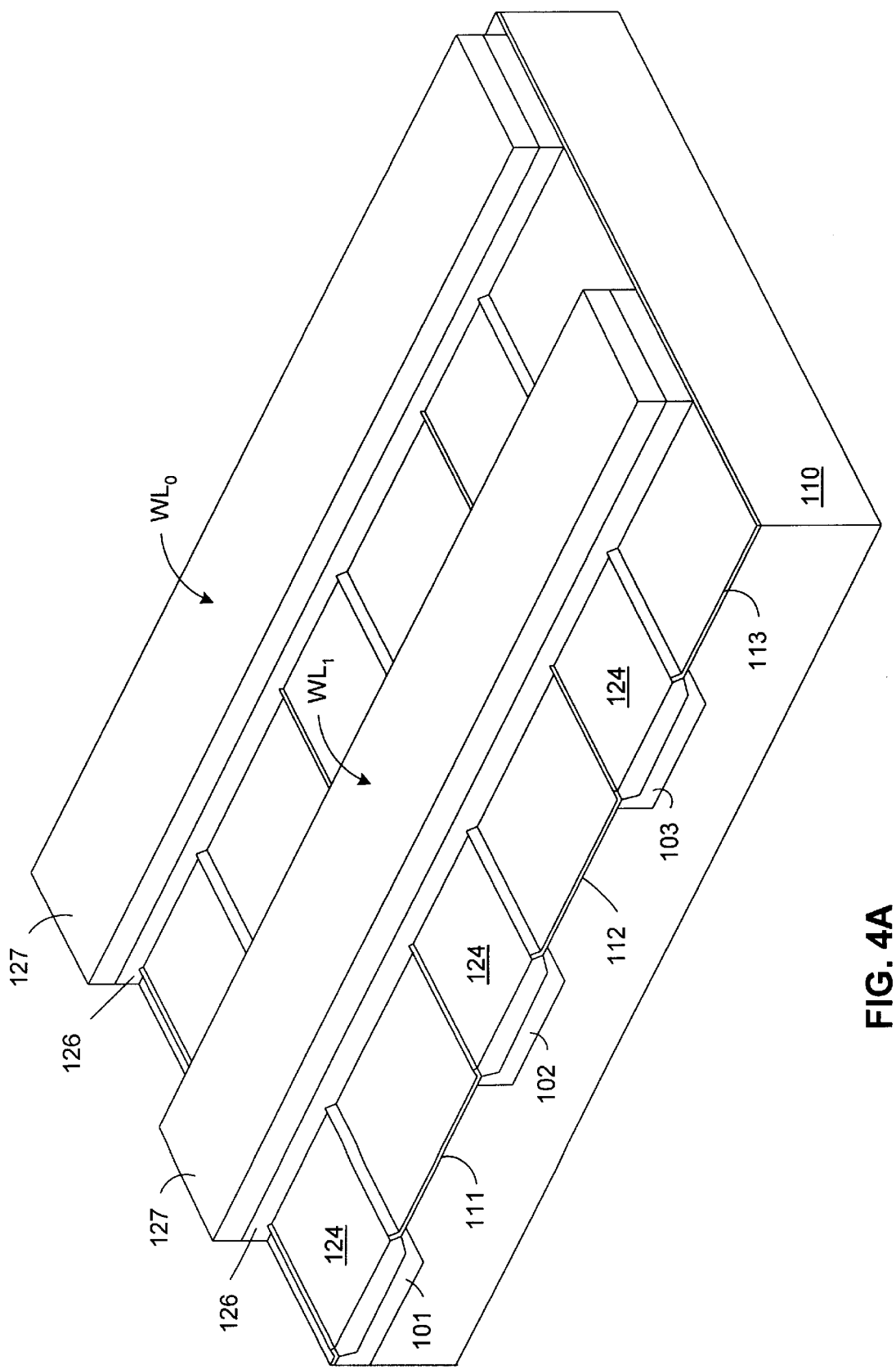
FIG. 4A is an isometric view of memory cells of the memory block of FIG. 3.
Figure 4B:
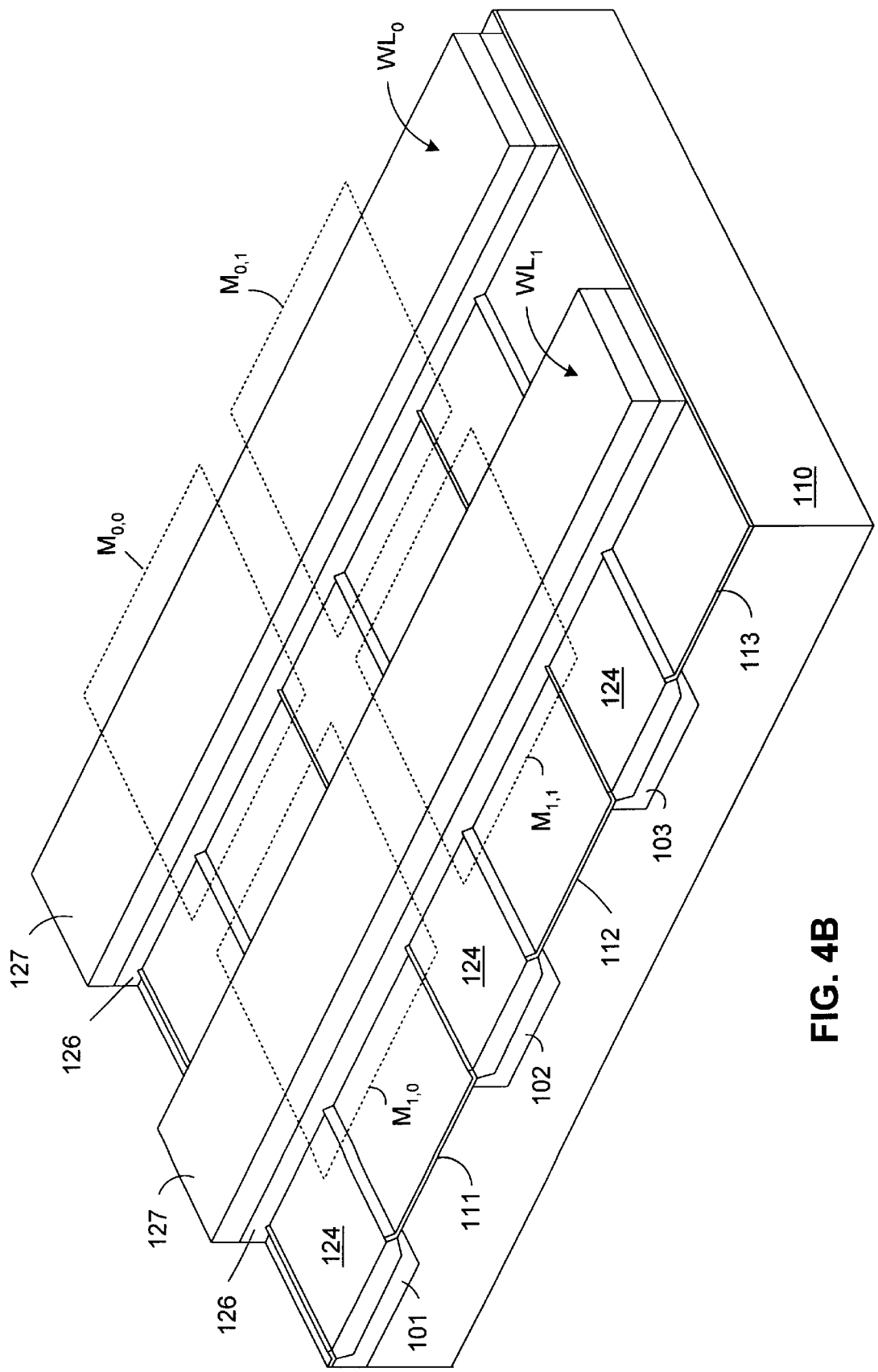
FIG. 4B illustrates the same isometric view as FIG. 4A, with the locations of the memory cells highlighted in dashed lines.
Figure 5:
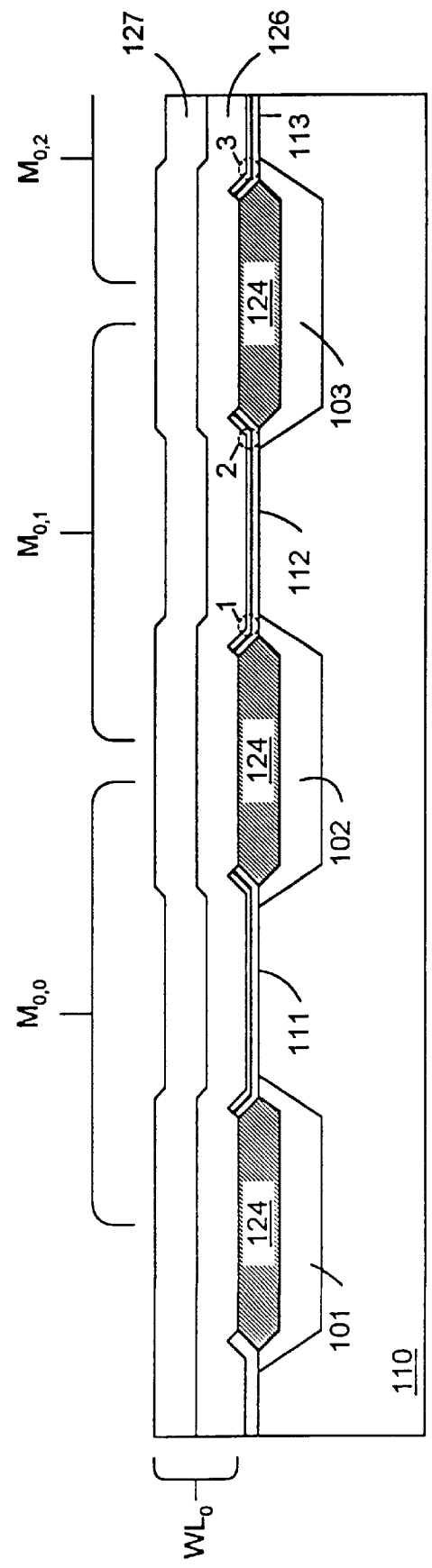
FIG. 5 is a cross sectional view of selected memory cells of FIG. 4A, taken along a word line.

FIG. 4A is an isometric view of memory cells $M_{0,0}$, $M_{0,1}$ $M_{1,0}$, and $M_{1,1}$. FIG. 4B illustrates the same isometric view as FIG. 4A, with the locations of memory cells $M_{0,0}$, $M_{0,1}$ $M_{1,0}$, and $M_{1,1}$ highlighted in dashed lines. FIG. 5 is a cross sectional view of memory cells $M_{0,0}$ and $M_{0,1}$ along the first axis through word line $WL_0$. Diffusion bit lines 101–103 are n-type regions formed in a p-type silicon semiconductor substrate 110. Diffusion bit lines 101–103 can also be formed in a p-well region. Bit line insulating regions 124 are formed over the diffusion bit lines 101–103. Bit line insulating regions 124 can be, for example, silicon oxide having a thickness of approximately 600 Å. Note that bit line insulating regions 124 are an order of magnitude thinner than conventional field oxide. ONO structures 111 and 112 extend over bit line insulating regions 124, diffusion bit lines 101–103 and substrate 110 in the manner illustrated. Word lines $WL_0$ and $WL_1$, which are polycide or salicide structures that include a layer of conductively doped polycrystalline silicon 126 and an overlying layer of metal silicide 127, extend over ONO structures 111 and 112 (and bit line insulating regions 124). Word lines $WL_0$ and $WL_1$ form the control gates of memory cells $M_{0,0}$, $M_{0,1}$ $M_{1,0}$, and $M_{1,1}$. The above-described structures of memory block 100 are fabricated using well-known CMOS processing steps.

Returning now to FIG. 3, the 2-bit memory cells of memory block 100 are accessed through high-voltage select transistors 131–138 and metal bit lines 141–144. High-voltage select transistors 131–138 are designed to have gate oxide sufficient to withstand the high voltages required for programming and erasing the memory cells. In general, select transistors 131–138 are controlled to selectively connect metal bit lines 141–144 to diffusion bit lines 101–108. The first power terminals of select transistors 131–138 are coupled to diffusion bit lines 101–108, respectively. The second power terminals of select transistors 131 and 133 are coupled to metal bit line 141. The second power terminals of select transistors 132 and 134 are coupled to metal bit line 142. The second power terminals of select transistors 135 and 137 are coupled to metal bit line 143. The second power terminals of select transistors 136 and 138 are coupled to metal bit line 144. The gates of select transistors 131 and 135 are commonly connected to a first select line $S_1$, while the gates of select transistors 133 and 137 are commonly connected to a second select line $S_2$. Similarly, the gates of select transistors 132 and 136 are commonly connected to a third select line $S_3$, while the gates of select transistors 134 and 138 are commonly connected to a fourth select line $S_4$.

The memory cells in memory block 100 are accessed as follows. Two of the select lines $S_1$–$S_4$ are pulled high, thereby turning on the select transistors coupled to these two select lines, and two of the select lines $S_1$–$S_4$ are pulled low, thereby turning off the select transistors coupled to these two select lines. The turned on select transistors couple two columns of memory cells to the metal bit lines 141–144.

For example, when select lines $S_2$ and $S_3$ are pulled high, and select lines $S_1$ and $S_4$ are pulled low, metal bit lines 141–142 are coupled to access the second column of memory cells., and metal bit lines 143–144 are coupled to access the seventh column of memory cells. More specifically, the logic high select lines $S_2$ and $S_3$ cause select transistors 132, 133, 136 and 137 to turn on, and the logic low select lines $S_1$ and $S_4$ cause select transistors 131, 134, 135 and 138 to turn off. Consequently, diffusion bit line 102 is coupled to metal bit line 142 and diffusion bit line 103 is coupled to metal bit line 141. Similarly, diffusion bit line 106 is coupled to metal bit line 144 and diffusion bit line 107 is coupled to metal bit line 143. As a result, signals provided on metal bit lines 141 and 142 are provided to control the memory cells in the second column of memory block 100, and signals provided on metal bit lines 143 and 144 are provided to control the memory cells in the seventh column of memory block 100.

A plurality of memory blocks, identical to memory block 100 can be coupled together along the first and second axes, thereby forming a larger memory array. Shared memory cells are formed at the interfaces between memory blocks along the first axis. More specifically, the right-most shared memory cells $MR_0$–$MR_{31}$ and $MR_S$ of one memory block combine with the left-most shared memory cells $ML_0$–$ML_{31}$ and $ML_S$ of an adjacent memory block to form another column of memory cells. Stated another way, the right-most diffusion bit line of one memory block combines with the left-most diffusion bit line of an adjacent memory block to form a shared column of memory cells. This shared column of memory cells is accessed by the right-most metal line in a memory block and the left-most metal bit line in the right-adjacent memory block. This shared column of memory cells is accessed when select lines $S_1$ and $S_4$ are pulled high and select lines $S_2$ and $S_3$ are pulled low. Note that under these conditions, access is provided to the following memory cells in memory block 100: shared memory cells $ML_0$–$ML_{31}$ and $ML_S$, shared memory cells $MR_0$–$MR_{31}$ and $MR_S$, and the fourth column of memory cells $M_{0,3}$–$M_{31,3}$ and $M_{S,3}$. Because each column of shared memory cells counts as a half column within memory block 100, there are effectively two accessed columns within memory block 100 under these conditions.

In the memory array described above, an additional diffusion bit line, metal bit line and select transistor must be added to the left side of each of the left-most memory blocks of the array. This enables the shared memory cells $ML_0$–$ML_{31}$ of the left-most memory blocks to be accessed. The additional diffusion bit line is coupled to the additional metal bit line through a select transistor. The gate of this select transistor is coupled to select line $S_4$. Similarly, an additional diffusion bit line, metal bit line, and select transistor must be added to the right side of each of the right-most memory blocks of the array, thereby enabling the shared memory cells $MR_0$–$MR_{31}$ of the right-most memory blocks to be accessed.

Access having been provided to all of the memory cells, program, read and erase operations are performed as follows.

For a read operation, the word line associated with the selected memory cell is maintained at the read voltage of 3 volts, while the word lines associated with the non-selected memory cells are held at a voltage of 0 Volts. One of the diffusion bit lines of the selected memory cell is held at a voltage of 2 Volts, and the other diffusion bit line is coupled to a sense amplifier, which is coupled to a voltage of about 0 Volts, such that a reverse read conditions exist for the selected memory cell. For example, to read the right charge trapping region R-1 of memory cell $M_{0,2}$, the word line $WL_0$ is held at a voltage of 3 Volts, while the word lines $WL_1$–$WL_{31}$ and $WL_S$ are held at 0 Volts. Diffusion bit line 104 is coupled to a sense amplifier (not shown), and a voltage of 2 Volts is applied to diffusion bit line 103, thereby creating reverse read conditions for right charge trapping region R-1 of memory cell $M_{0,2}$. Under these conditions, the non-selected memory cells are neither read nor disturbed.

For a programming operation, the word line associated with the selected memory cell is held at a programming voltage of 11 volts, while the word lines associated with the non-selected memory cells are held at a voltage of 0 Volts. The source region of the selected memory cell is maintained at a voltage of 0 Volts, and the drain region of the selected memory cell is maintained at a voltage of about 4.5 to 5.5 Volts. For example, to program the right charge trapping region R-1 of memory cell $M_{0,1}$, the word line $WL_0$ is held at a voltage of 11 Volts, while the word lines $WL_1$–$WL_{31}$ and $WL_S$ are held at 0 Volts. A voltage of about 4.5 to 5.5 Volts is applied to diffusion bit line 104, and a voltage of 0 Volts is applied to diffusion bit line 103, thereby creating a program condition for right charge trapping region R-1 of memory cell $M_{0,2}$. The duration of the programming operation is on the order of micro-seconds. Note that the duration of the programming operation is not long enough and the applied drain voltage of about 4.5 to 5.5 Volts is not high enough to cause the non-selected memory cells to be erased during the programming operation.

An erase operation is performed by applying 0 Volts to the gate of a selected memory cell and applying 8 Volts to the drain region of the selected memory cell. In general, erase operations in memory block 100 cannot be limited to a single memory cell. For example, the right charge trapping region R-1 of memory cell $M_{0,2}$ would be erased as follows. First, the select transistors 133 and 134 are turned on, thereby providing access to the third column of memory block 100 by coupling metal bit lines 141 and 142 to diffusion bit lines 103 and 104, respectively. An erase voltage of 8 Volts is applied to diffusion bit line 104, and 0 Volts is applied to word line $WL_0$.

Under these conditions, the right charge trapping region R-1 of memory cell $M_{0,2}$ is erased. However, under these conditions, the left charge trapping region L-2 of the adjacent memory cell $M_{0,3}$ is also erased. Moreover, if the non-selected word lines $WL_1$–$WL_{31}$ and $WL_S$ held at 0 Volts, then the right charge trapping regions of all of the memory cells in the second column and the left charge trapping regions of all of the memory cells in the third column are also erased. As a result, the erase operation will erase a minimum of 64 bits. Raising the voltages on the non-selected word lines may eliminate the erase conditions, but may, in turn, create undesirable programming conditions.

To overcome these problems, the memory block 100 is preferably operated as an EEPROM array utilizing the methods disclosed in co-owned and co-pending U.S. application Ser. No.___, filed herewith, entitled "EEPROM ARRAY USING 2-BIT NON-VOLATILE MEMORY CELLS" [Attorney Docket No. TSL-001], which is incorporated herein by reference in its entirety.

Redundancy Methods and Structures

The redundancy method of the present invention is directed in particular to memory arrays such as memory array 100 (see FIG. 3) that include 2-bit memory cells 10 (see FIG. 2). However, the methods disclosed below may be used beneficially in other non-volatile memory arrays.

All flash memory cells have a limited operating lifetime. In the case of conventional floating gate memory cells, this operating lifetime is limited by the ability of the floating gate to store electrons. In contrast, the operating lifetime of a 2-bit flash memory cell is limited by its ability to achieve an erased state. Specifically, referring briefly to FIG. 2, electrons are inserted during programming into a small target portion of charge trapping region 26 by hot electron injection. During a subsequent erase procedure, a field is generated that causes enough of the electrons to be extracted from the small target region to return the cell to an erased state. However, during some programming procedures, errant electrons are occasionally inserted into portions of charge trapping region 26 that are located outside of the small target portion. During erase procedures, these "misplaced" electrons are subjected to a weaker field than that applied to the small target portion, and are therefore often not extracted. After a large number of program/erase cycles, the number of these "misplaced" electrons increases until the cell fails to achieve an erased state after normal-length erase procedures. That is, these "misplaced" electrons cause the cell to perform as a programmed cell, even after the normal number of electrons are extracted from the small target portion of charge trapping region 26. To achieve an erased state under these conditions, a longer erase period is utilized to extract additional electrons out of the small target portion. As the number of "misplaced" electrons continues to increase, the length of the erase period also increases. Eventually, the amount of time required to erase a cell becomes impractical, at which point the cell is considered "worn out". A typical charge trapping region 26 of 2-bit memory cell 10 is believed to wear out somewhere in the range of 10,000 to 100,000 program/erase cycles.

As disclosed above, each memory block 100 includes 256 memory cells 10 arranged in 32 rows, each row including eight memory cells. Because each memory cell 10 includes two charge trapping regions (i.e., each memory cell 10 stores two bits of information), memory block 100 has the capacity to store 512 data bits.

In accordance with the redundancy method of the present invention, instead of using the 512 charge trapping regions of block 100 to store 512 bits, these charge trapping regions are divided into 64 bit locations, each bit location being assigned eight charge trapping regions. An initial (first) charge trapping of each bit location is used to store bit data for the bit location, with the remaining seven charge trapping regions being reserved (i.e., redundant). Predefined operating parameters are set for use of the initial charge trapping region (e.g., the amount of time required to program/erase the first charge trapping region, or a maximum of 100,000 program/erase cycles). The initial charge trapping region is used to store bit data addressed to the bit location until an actual operating parameter (such as the actual number of program/erase cycles) associated with the initial charge trapping region corresponds with the predefined operating parameter. At that time, one of the redundant charge trapping regions replaces the first charge trapping region, and bit data addressed to the bit location is stored in the redundant charge trapping regions. That is, bit data originally addressed to the initial charge trapping region is now stored in a redundant charge trapping region. By repeating this replacement process for all seven redundant charge trapping regions, the effective life of the memory array is increased by eight times. That is, instead of being limited to a minimum operational lifetime of 10,000 program/erase cycles, memory arrays operated in accordance with the present invention have a minimum lifetime of 80,000 program/erase cycles.

Figure 6A:
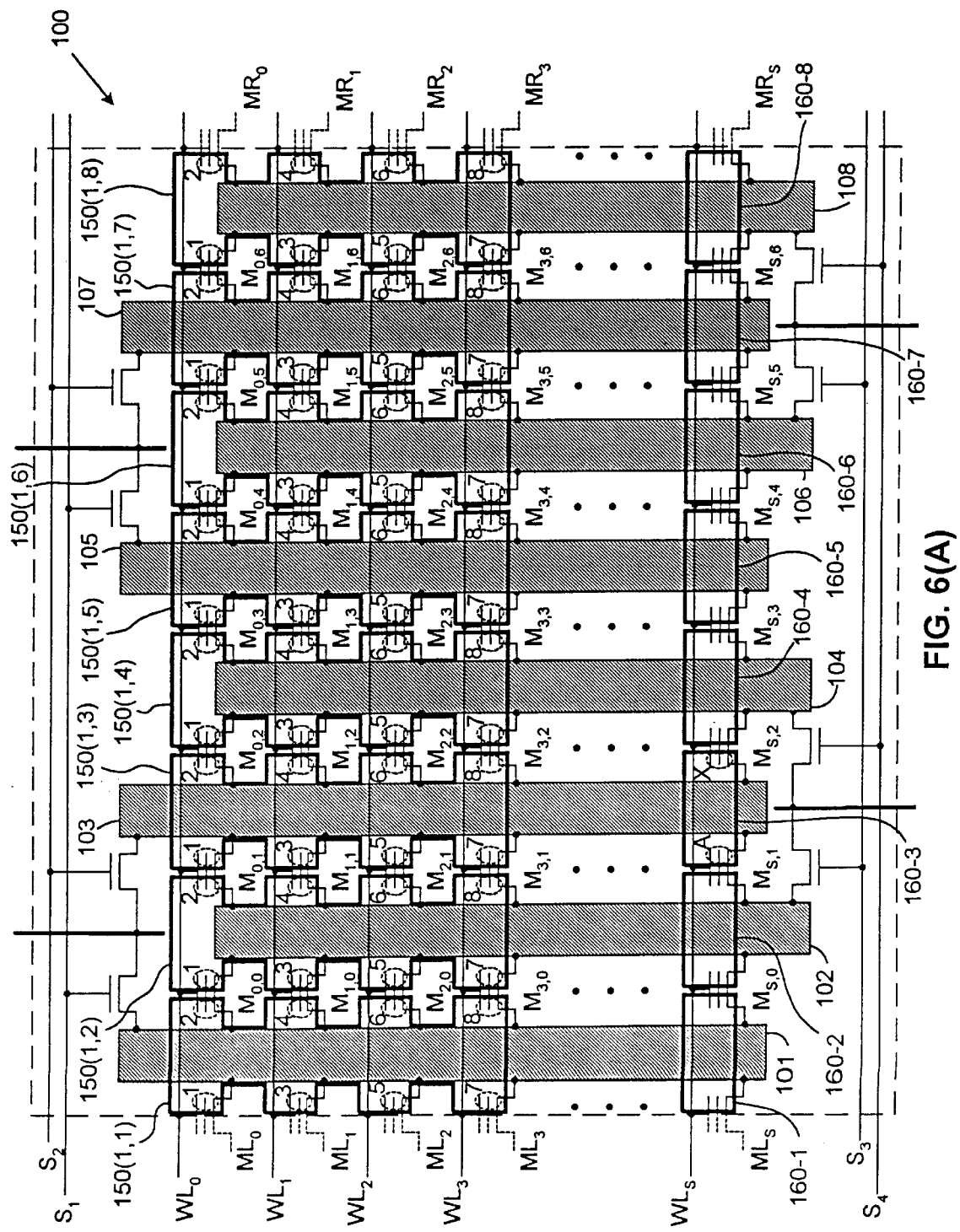
FIGS. 6(A), 6(B) and 6(C) are simplified schematic and block diagrams showing a memory array in accordance with an embodiment of the present invention.
Figure 6B:
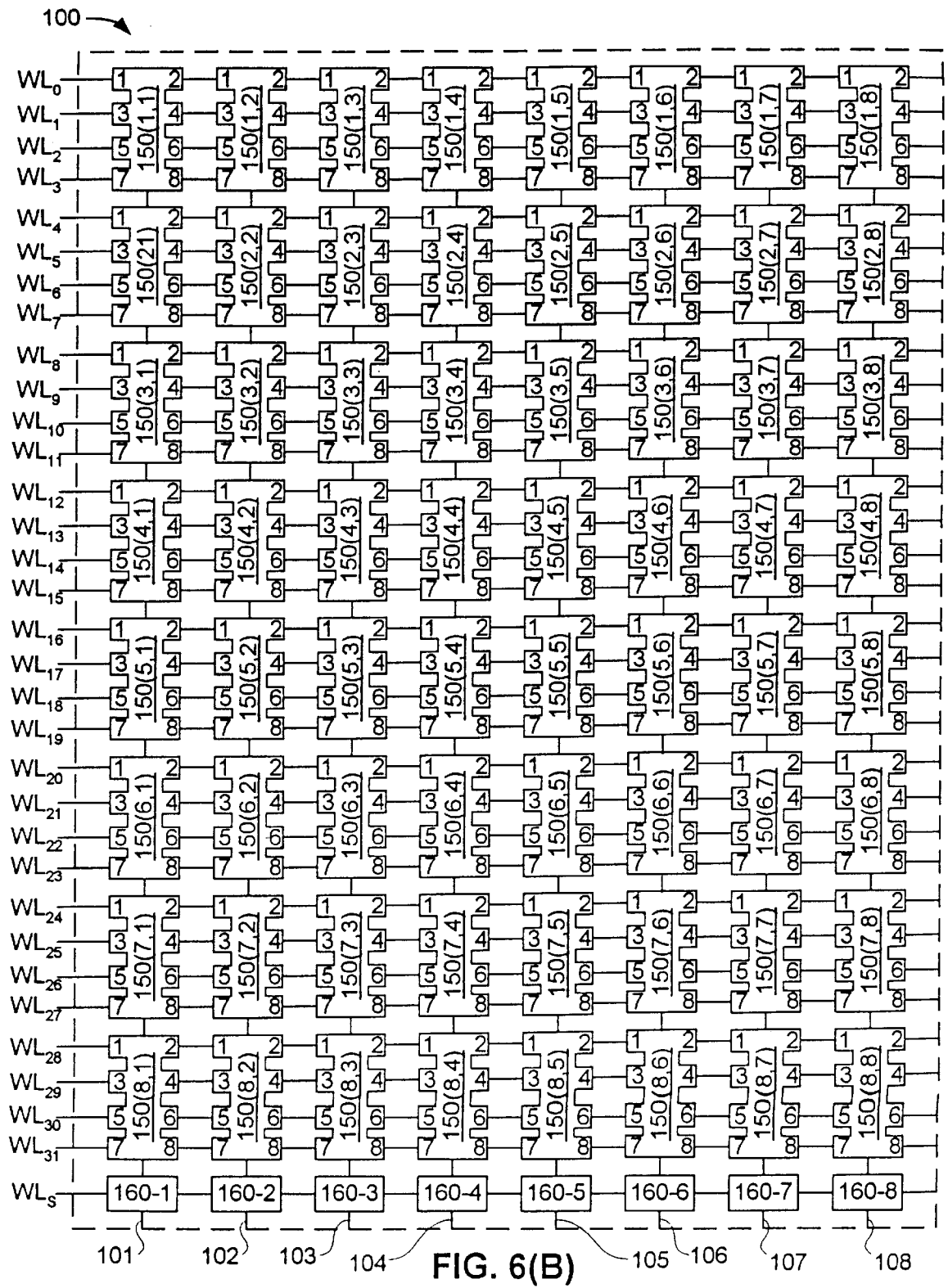
Figure 6C:
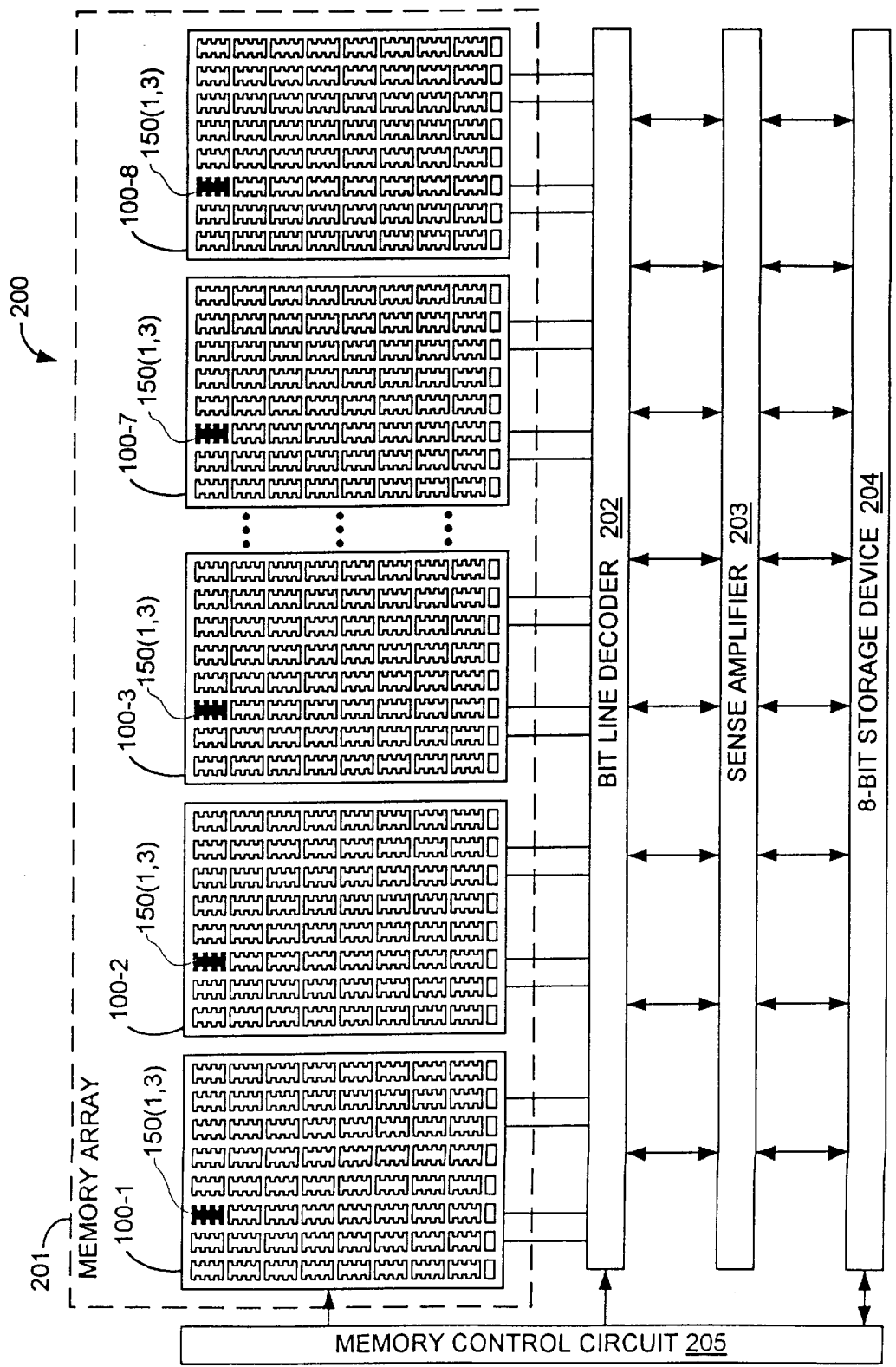

FIGS. 6(A), 6(B) and 6(C) show a memory array whose charge trapping regions are grouped into bit locations in accordance with an embodiment of the present invention. FIG. 6(A) shows one row of bit locations 150(1,1) through 150(1,8) of memory block 100. FIG. 6(B) is a simplified diagram indicating the array of 64 bit locations 150(1,1) through 150(8,8) of block 100. FIG. 6(C) is a block diagram of a memory system 200 that uses eight memory blocks 100-1 through 100-8 to store 64 bytes.

Referring to FIG. 6(A), bit locations 150(1,1) through 150(1,8) are formed by the top four rows of memory cells $M_{0,0}$–$M_{3,6}$, $ML_0$–$ML_3$ and $MR_0$–$MR_3$. Each bit location 150(1,1) through 150(1,8) is associated with one diffusion bit line 101–108. For example, bit location 150(1,1) is associated with diffusion bit line 101 and includes charge trapping regions 1, 3, 5 and 7 located along the left side of diffusion bit line 101, and charge trapping regions 2, 4, 6 and 8 located along the right side of diffusion bit line 101. Similarly, bit locations 150(1,2) through bit locations 150(1,8) include charge trapping regions 1–8 formed along the sides of diffusion bit lines 102–108, respectively. The eight charge trapping regions 1–8 of each of the bit locations 150(1,1) through 150(1,8) are controlled by word lines $WL_0$–$WL_3$. In particular, charge trapping regions 1 and 2 of each bit location are controlled by word line $WL_0$, charge trapping regions 3 and 4 are controlled by word line $WL_1$, charge trapping regions 5 and 6 are controlled by word line $WL_2$, and charge trapping regions 7 and 8 are controlled by word line $WL_3$. The process of addressing a particular charge trapping region that is discussed above applies to bit locations 150(1,1) through 150(1,8). For example, to read a value stored in charge trapping region 1 of bit location 150(1,3), a 3 volt signal is applied to word line $WL_0$ (all other word lines are maintained at 0 volts), 0 volts is applied to diffusion bit line 103, and a 2 volt signal is applied to diffusion bit line 102. Conversely, to read a value stored in charge trapping region 8 of bit location 150(1,3), a 3 volt signal is applied to word line $WL_3$ (all other word lines are maintained at 0 volts), 0 volts is applied to diffusion bit line 103, and a 2 volt signal is applied to diffusion bit line 104.

FIG. 6(B) is a simplified diagram showing all 64 bit locations 150(1,1) through 150(8,8) of block 100. The 64 bit locations are arranged in eight rows and eight columns. Each row is controlled by four of the 32 word lines $WL_0$–$WL_{31}$, and each column includes 64 charge trapping regions associated with one of the diffusion bit lines 101–108. The top row includes bit locations 150(1,1) through 150(1,8) that are controlled by word lines $WL_0$–$WL_3$ and are connected to diffusion bit lines 101–108, as shown in FIG. 6(A). The remaining rows are arranged in a manner consistent with the top row.

FIG. 6(C) is a block diagram of a memory system 200 formed in accordance with an embodiment of the present invention. Memory system 200 includes memory array 201, bit line decoder circuit 202, sense amplifier circuit 203, 8-bit storage device 204 and memory control circuit 205. Memory array 201 includes eight memory blocks 100-1 through 100-8 (five are shown) that are identical to memory block 100 (discussed above). The metal bit lines of memory array 201 are routed to bit line decoder circuit 202. Bit line decoder circuit 202 is controlled to route a predetermined set of bit lines to sense amplifier circuit 203 in response to a column address received from memory control circuit 205. For example, metal bit lines 141–142 (see FIG. 3) are routed to sense amplifier circuit 203 in the present example. Bit line decoder 202 is described in additional detail in co-owned and co-pending U.S. application Ser. No. 09/243,976, entitled "COLUMN DECODER FOR AN EEPROM ARRAY USING 2-BIT NON-VOLATILE MEMORY CELLS" [Attorney Docket No. TSL-016], which is incorporated herein by reference in its entirety.

Sense amplifier circuit 203 is coupled to storage device 204. Storage device 204 is configured to store one 8-bit byte. Memory control circuit 205 provides address signals to control the access of storage device 204. Storage device 204 can be, for example, a shift register formed by a static random access memory (SRAM) or a flash memory.

In the present example, memory control circuit 205 controls memory array 201 such that one byte is read/written from/to corresponding bit locations in each of the eight blocks 100-1 through 100-8. For example, each of the eight bit locations 150(1,3) of blocks 100-1 through 100-8 (which are darkened for identification) store one data bit of one byte. In accordance with redundancy data stored in memory array 201 (discussed below), memory control circuit 205 addresses the appropriate word line to read the data stored in each of the bit locations 150(1,3). Memory control circuit 205 further controls bit line decoder circuit 202 to route these parallel bits to sense amplifier circuit 203 and storage device 204. Thus, memory control circuit 205 causes the bit data from bit locations 150(1,3) to be written to storage device 204 as an 8-bit byte. This byte can be read from storage device 204 in serial or in parallel, depending on the needs of the user.

In accordance with an embodiment of the present invention, redundancy data is stored in a supplemental memory location that is used by the addressing circuitry to identify which of the eight charge trapping regions is currently used to store bit data in each bit location. This supplemental memory location is preferably provided in the memory array 201, but can be located anywhere within memory system 200 (see FIG. 6(C)). For example, a separate memory block 100 may be provided for storing the redundancy data for individual blocks or columns of bit locations. Before each read or write operation, the redundancy data is read such that the read/write operation is directed to the appropriate charge trapping region of each bit location. In another example, the supplemental memory location may contain information for memory array 200 that identifies a selected one of the eight charge trapping regions used in all of the bit locations 150(1,1) through 150(8,8) of all memory blocks.

A presently preferred structure for storing redundancy data is provided as an additional row of memory cells 10 in each block 100. Referring to FIG. 6(A), this additional row is located at the bottom of block 100, and is formed by supplemental 2-bit memory cells $M_{S,0}$–$M_{S,6}$ and supplemental shared memory cells $ML_S$ and $MR_S$ that are controlled by supplemental word line $WL_S$. One redundancy bit pair 160-1 through 160-8 of charge trapping regions is assigned to each of the diffusion bit line 101–108 (i.e., to each column of bit locations). For example, redundancy bit pair 160-3 includes charge trapping regions A and X that are coupled to diffusion bit line 103, and is used to identify which of the charge trapping regions 1–8 of bit location 150(1,3) is currently used to store bit data.

As discussed above with reference to FIG. 6(C), when a byte is read from memory array 201, one bit is read from each block 100-1 through 100-8. In the example shown in FIG. 6(C), one bit is read from each of the memory locations 150(1,3) in blocks 100-1 through 100-8. In the present embodiment, eight bits of redundancy data are read from redundancy pairs 160-3 in each of the blocks 100-1 through 100-8. In particular, one redundancy bit is read from the left charge trapping region (such as charge trapping region A in FIG. 6(A)) in each of the redundancy pairs 160-3. These eight redundancy bits are used by the addressing circuitry to identify the currently-used charge trapping regions in all eight bit locations 150(1,3). That is, after the redundancy data is read from the redundancy pairs 160-3, the redundancy data is decoded and used by memory control circuit 205 to apply a 3 volt signal to the appropriate word line $WL_0$–$WL_3$, and to transmit control signals to bit line decoder 202 such that the appropriate diffusion bit line 102 or 104 receives a 2 volt signal.

Figure 7A:
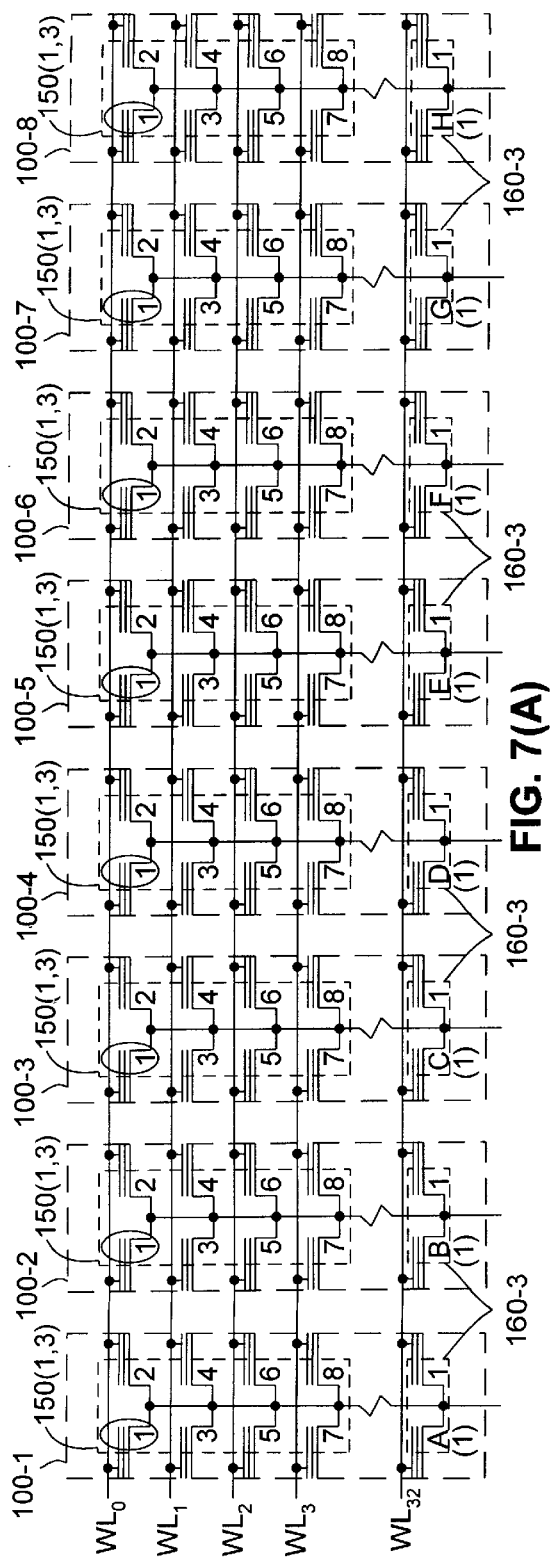
Figure 7B:
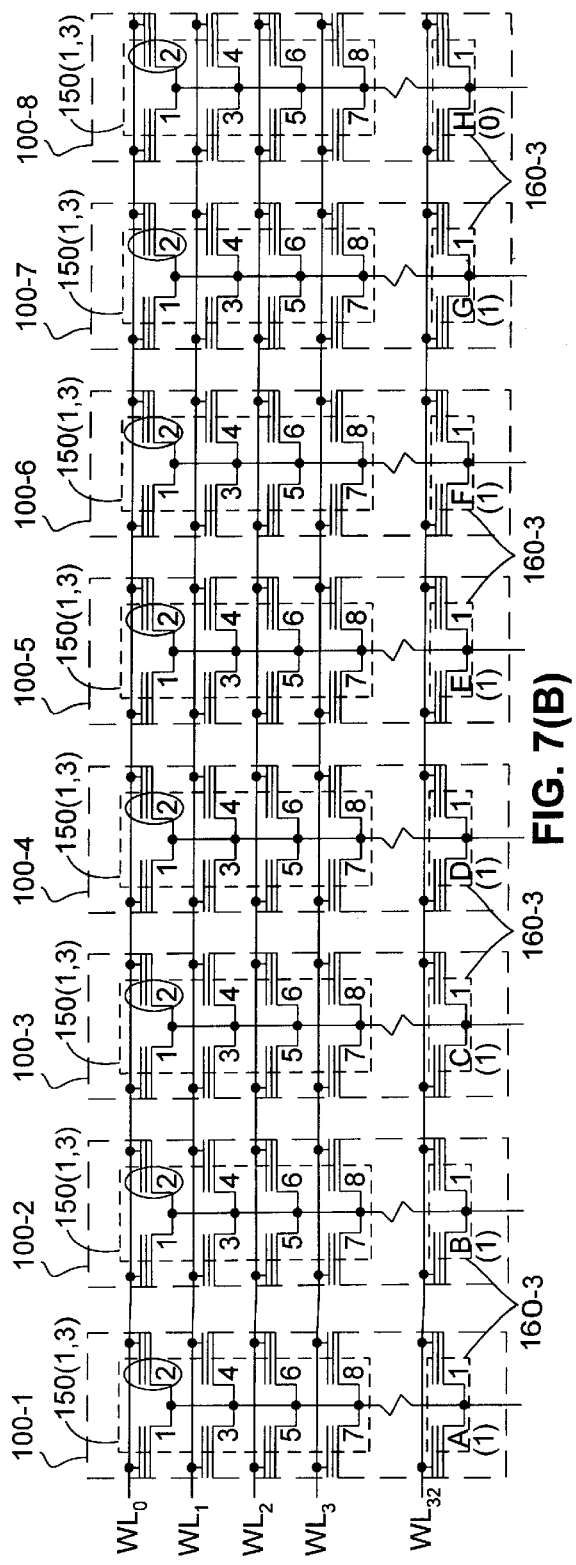

FIGS. 7(A) through 7(D) illustrate an example of how redundancy data is used to identify the currently-used charge trapping region in each bit location of memory array 201. Referring to FIG. 7(A), a portion of blocks 100-1 through 100-8 is shown that includes bit locations 150(1,3) and corresponding redundancy pairs 160-3. Eight redundancy bits are stored in charge trapping regions A through H of redundancy pairs 160-3. In this embodiment, charge trapping regions X of redundancy pairs 160-3 are not used to store redundancy data. As indicated in FIG. 7(A), when all eight charge trapping regions A through H are erased (i.e., all store logic one (1)), the addressing circuitry addresses initial charge trapping region 1 in each bit location 150(1,3) (indicated by the oval shape surrounding charge trapping regions 1). Referring now to FIG. 7(B), when the initial charge trapping region 1 wears out in one or more of blocks 100-1 through 100-8, the redundancy data is updated by programming charge trapping region H of block 100-8 (i.e., such that charge trapping region H stores a logic zero (0)). This redundancy data value (i.e., 11111110) causes the addressing circuitry to address the first redundant charge trapping region (in this case, region 2) in each bit location 150(1,3). Note that bit data is no longer written to or read from initial charge trapping region 1. As shown in FIG. 7(C), subsequent operational decline of first redundant charge trapping region 2 in one or more of the blocks 100-1 through 100-8 is addressed by programming charge trapping region G of block 100-7 (i.e., such that charge trapping region G stores a logic zero (0)). Note that the charge trapping region H is now in a "don't care" (X) state. In the present embodiment, when the redundancy data is decoded, the most significant redundancy bit that is programmed (logic 0) identifies the currently-used charge trapping region. Finally, as shown in FIG. 7(D), after redundant charge trapping regions 2–7 are worn out, the final redundant charge trapping region 8 is designated as the currently-used charge trapping region by programming charge trapping region B in block 100-2 to store a logic zero (0) (all other redundancy bits are "don't care"). Using this method, the currently-used charge trapping regions of bit locations 150(1,3) in all eight blocks 100-1 through 100-8 is controlled by the programmed state of only one (e.g., the most significant) of the eight charge trapping regions A through H of redundancy pairs 160-3.

In accordance with the above example, redundancy data is stored in the same location (in this case, the left charge trapping region) in each redundancy pair of blocks 100-1 through 100-8. This storage arrangement allows the addressing circuitry to quickly access the redundancy data before reading/writing to the addressed bit locations. However, as discussed above, all charge trapping regions connected to a diffusion bit line (e.g., bit line 103) are erased when one bit is erased. Therefore, supplemental charge trapping regions A through H are erased each time the bit data stored by bit locations 150(1,3) is erased. To prevent the loss of redundancy data caused by the performance decline (i.e., wearing out) of one of supplemental charge trapping regions A through H, only one of the supplemental charge trapping regions A through H (e.g., the most significant) is programmed to identify the currently-used charge trapping region from among the redundant charge trapping region 2–8. This prevents the process of erasing from prematurely wearing out a supplemental charge trapping region. That is, because only one supplemental charge trapping region A through H is programmed for each redundant charge trapping region 2–8, each supplemental charge trapping region is subjected to the same number of program/erase cycles as one of the data-storing charge trapping regions. Therefore, the present embodiment provides the advantage of storing redundancy data using the same memory cells used to store bit data, thereby minimizing modifications to the prior art structure (that is, all that is required is an additional row of memory cells in each memory block 100). Further, the method of programming only one supplemental charge trapping region A through H at a time prevents the failure of the supplemental charge trapping regions (i.e., the loss of redundancy data) before all of the redundant charge trapping regions 2–7 are used in each bit location 150(1,3).

Figure 8A:
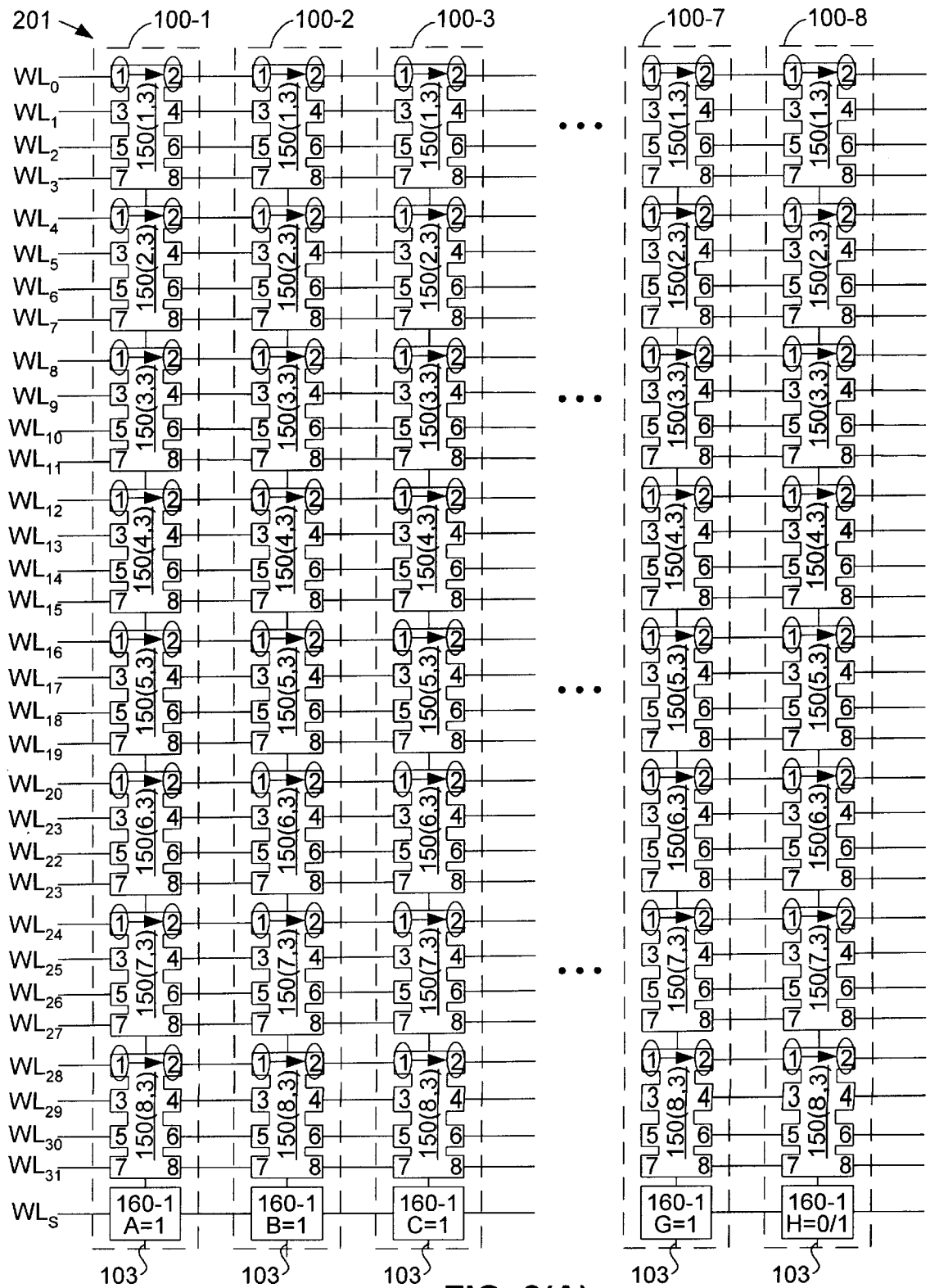
FIGS. 8(A), 8(B) and 8(C) are partial schematic diagrams showing examples of how redundancy data is stored and used to address specific charge trapping regions in different columns of the memory array.
Figure 8B:
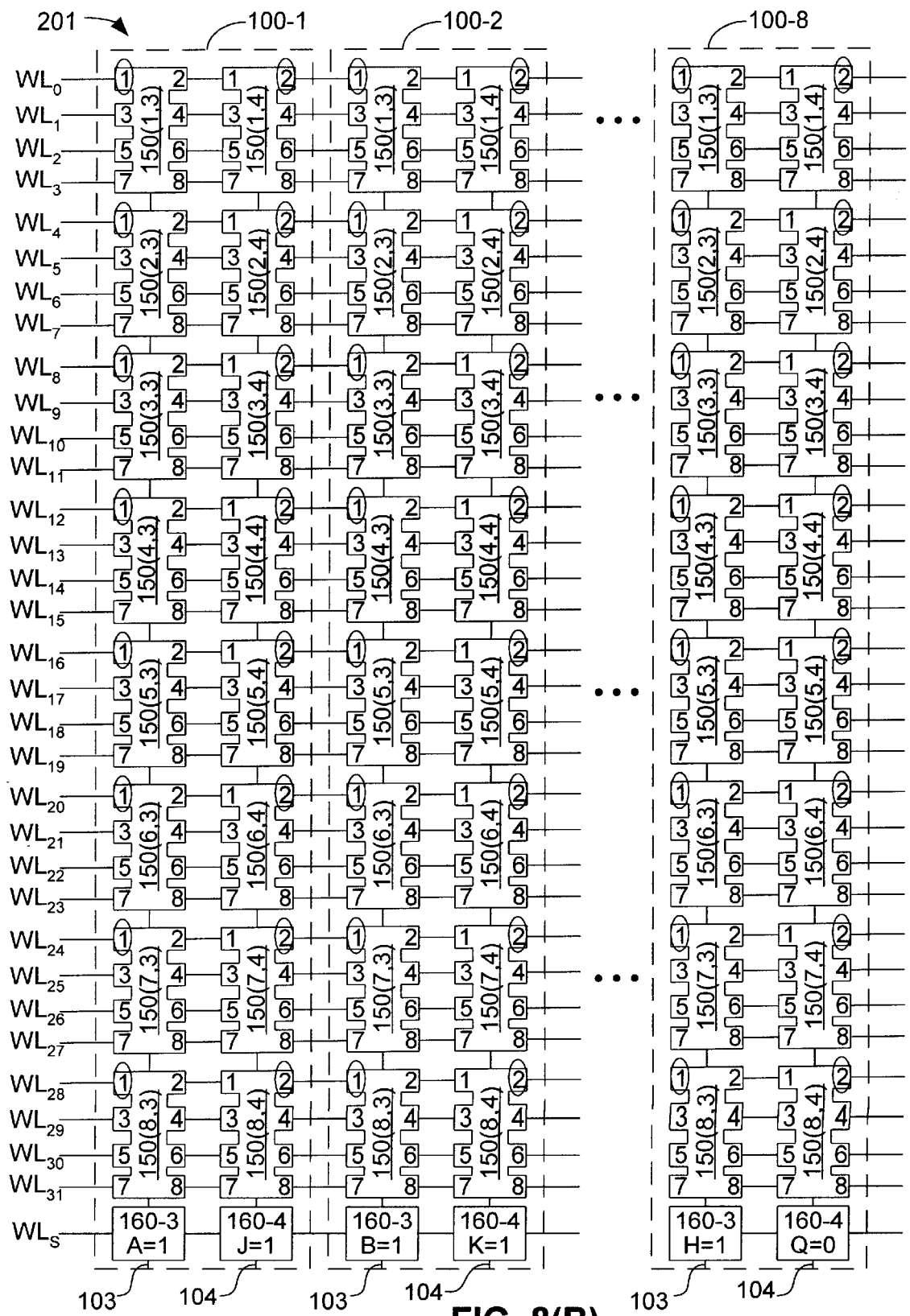

FIGS. 8(A) and 8(B) show portions of memory array 201, the above example will now be extended to the other bit locations of blocks 100(1) through 100(8).

Referring to FIG. 8(A), all bit locations in related rows of blocks 100-1 through 100-8 are controlled by the same eight redundancy bits. For example, FIG. 8(A) shows that when charge trapping region H changes from logic one to logic zero, the currently-used charge trapping region for bit locations 150(1,3) through 150(1,8) in blocks 100-1 through 100-8 change from initial charge trapping region 1 to first redundant charge trapping region 2. As mentioned above, all eight bit locations 150(1,3) through 150(8,3) arranged along diffusion bit line 103 are erased simultaneously, along with the redundancy data stored in redundancy pair 160-3. Therefore, the eight redundancy data bits stored in redundancy pairs 160-3 are used to control 64 bit locations (eight rows by eight columns).

In contrast to the example shown in FIG. 8(A), FIG. 8(B) shows that bit locations in different columns of blocks 100-1 through 100-8 are controlled by different groups of eight redundancy bits. For example, FIG. 8(B) shows that bit locations 150(1,3) through 150(1,8) in blocks 100-1 through 100-8 are controlled by supplemental charge trapping regions A–H such that the currently-used charge trapping region is initial charge trapping region 1. Conversely, bit locations 150(1,4) through 150(8,4) in blocks 100-1 through 100-8 are controlled by supplemental charge trapping regions J–Q. In this example, redundancy bit Q is programmed (logic zero), so that the currently-used charge trapping region in all 64 bit locations controlled by supplemental charge trapping regions J–Q (i.e., bit locations 150 (1,4) through 150(8,4)) is first redundant charge trapping region 2. Summarizing, eight groups of redundancy data bits are stored in redundancy pairs 160-1 through 160-8, each group controls 64 bit locations (eight bytes).

By storing different redundancy data for each column of bit locations, as provided in the above examples, the number of program/erase cycles for memory array 201 is statistically increased. That is, when operational parameters (such as programming/erase time) are used to determine when a charge trapping region is worn out, a "weakest" charge trapping region controls the switching decision. When this "weakest" charge trapping region wears out in one of the bit locations, the currently-used charge trapping region is switched for all of the bit locations associated with the "weakest" charge trapping region. By controlling groups of 64 bit locations with eight redundancy bits, a greater probability exists that the useful operational lifetime of the memory array will be increased over a case in which the eight "weakest" charge trapping regions 1–8 control the entire memory array. For example, referring to FIG. 8(B), assume that charge trapping regions 1, 3, 5 and 7 of bit location 150(1,3) and charge trapping regions 2, 4, 6 and 8 of bit location 150(1,4) are "weak" (i.e., wear out at 10,000 program/erase cycles), and that all other charge trapping regions wear out at 50,000 cycles. If all of the bit locations of both columns are controlled by the same redundancy bits, then the operational lifetime of the memory array is limited to 80,000 program/erase cycles. By controlling the column including bit location 150(1,3) using redundancy bits A–H, and the column including bit location 150(1,4) using redundancy bits J–Q, the operational lifetime of the memory array is increased to 240,000 cycles.

Figure 8C:
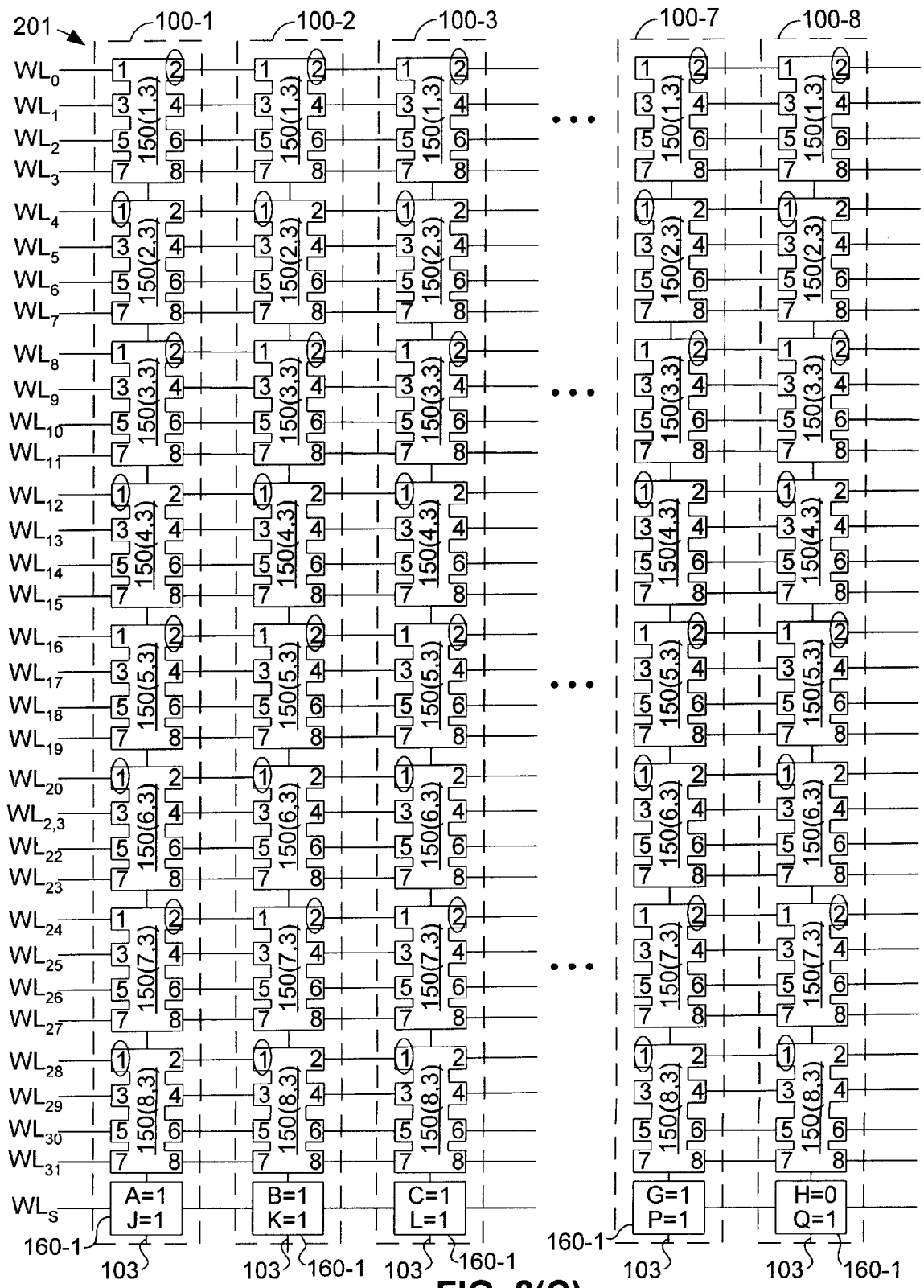

FIG. 8(C) shows another example in which both redundancy data bits redundancy pairs 160-1 are used to independently control alternate bit locations in the same columns of blocks 100-1 through 100-8. In this example, the first, third, fifth and seventh rows of bit locations (i.e., word lines $WL_0$–$WL_3$, $WL_8$–$WL_{11}$, $WL_{16}$–$WL_{19}$ and $WL_{24}$–$WL_{27}$ are controlled by redundancy bits A–H. In contrast, the second, fourth, sixth and eighth rows of bit locations (i.e., word lines $WL_4$–$WL_7$, $WL_{12}$–$WL_{15}$, $WL_{20}$–$WL_{23}$ and $WL_{28}$–$WL_{31}$ are controlled by redundancy bits J–Q. The redundancy bit for a particular row of bit locations can be easily determined from the address for these bit locations. In this example, redundancy bit H is programmed (logic zero) and redundancy bit Q is erased (logic one). Therefore, the currently-used charge trapping region in the bit locations of the first, third, fifth and seventh rows is charge trapping region 2, and the currently-used charge trapping region in the bit locations of the second, fourth, sixth and eighth rows is charge trapping region 1. By controlling half of the rows with one set of redundancy bits and the other half of the rows with the other set of redundancy bits, the operational lifetime of the memory array can be further statistically increased.

Figure 9A:
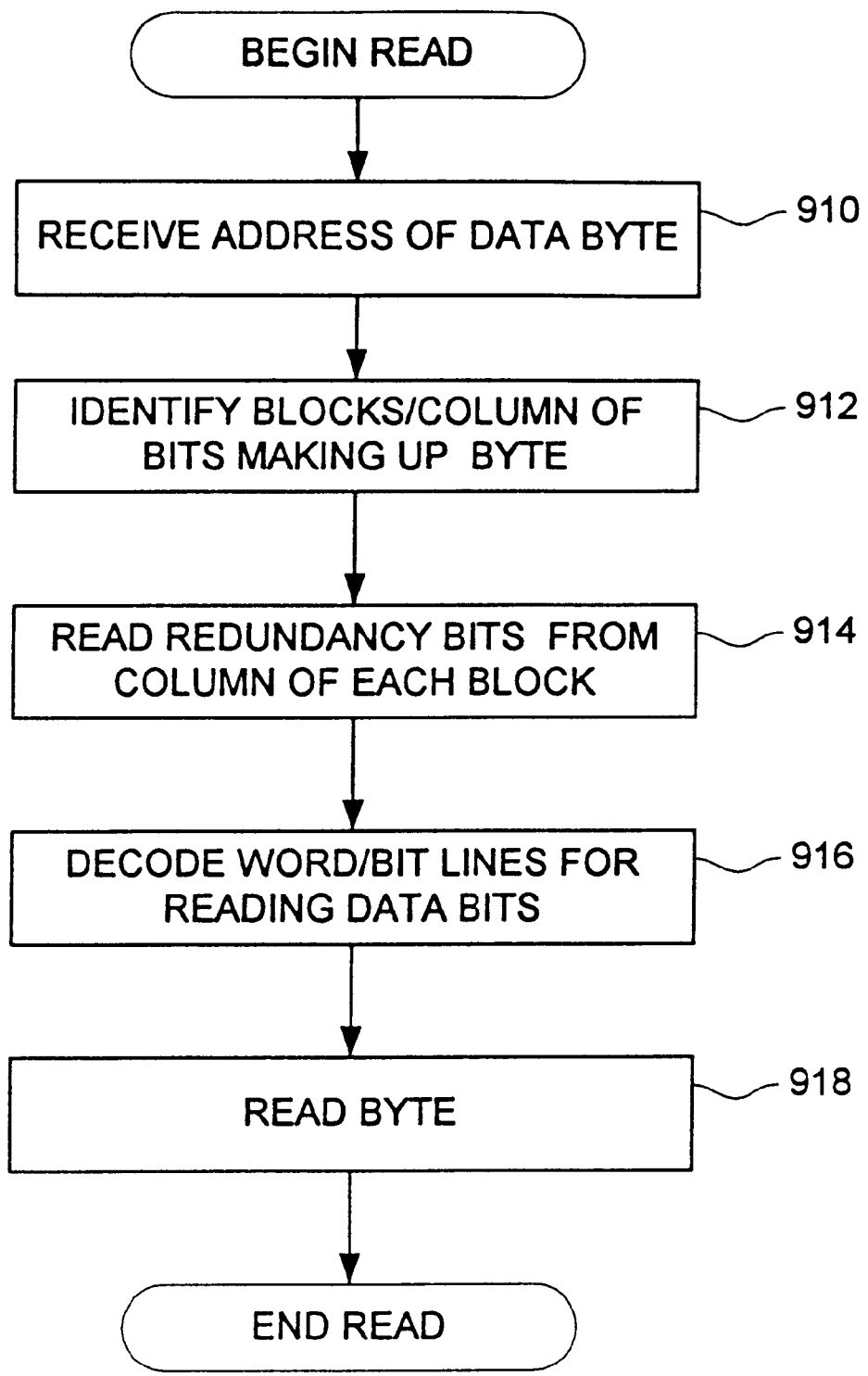
FIGS. 9(A), 9(B) and 9(C) are flow diagrams showing process steps for reading and writing data to one of the eight charge trapping regions assigned to a bit location in accordance with an embodiment of the present invention.
Figure 9B:
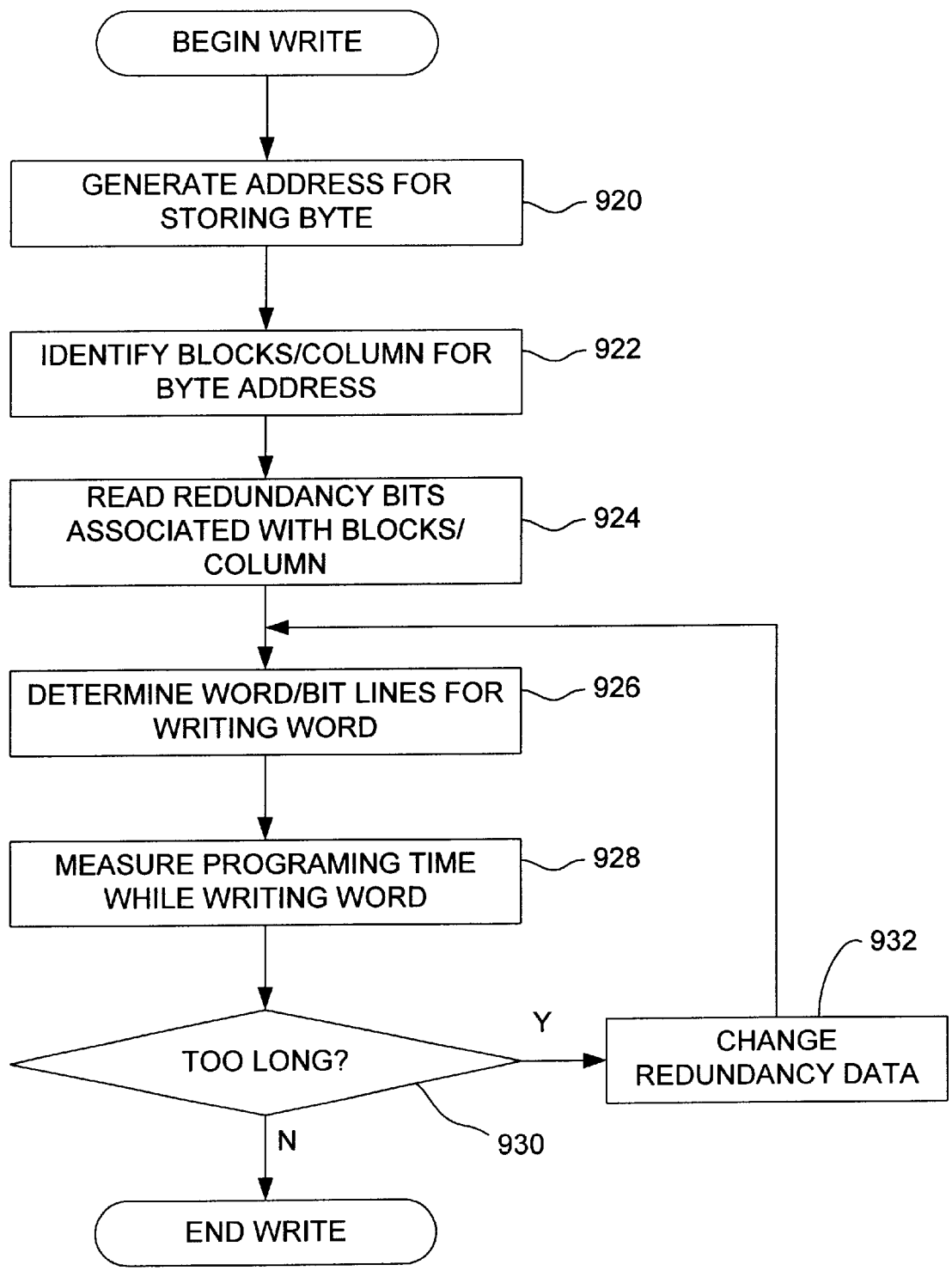
Figure 9C:
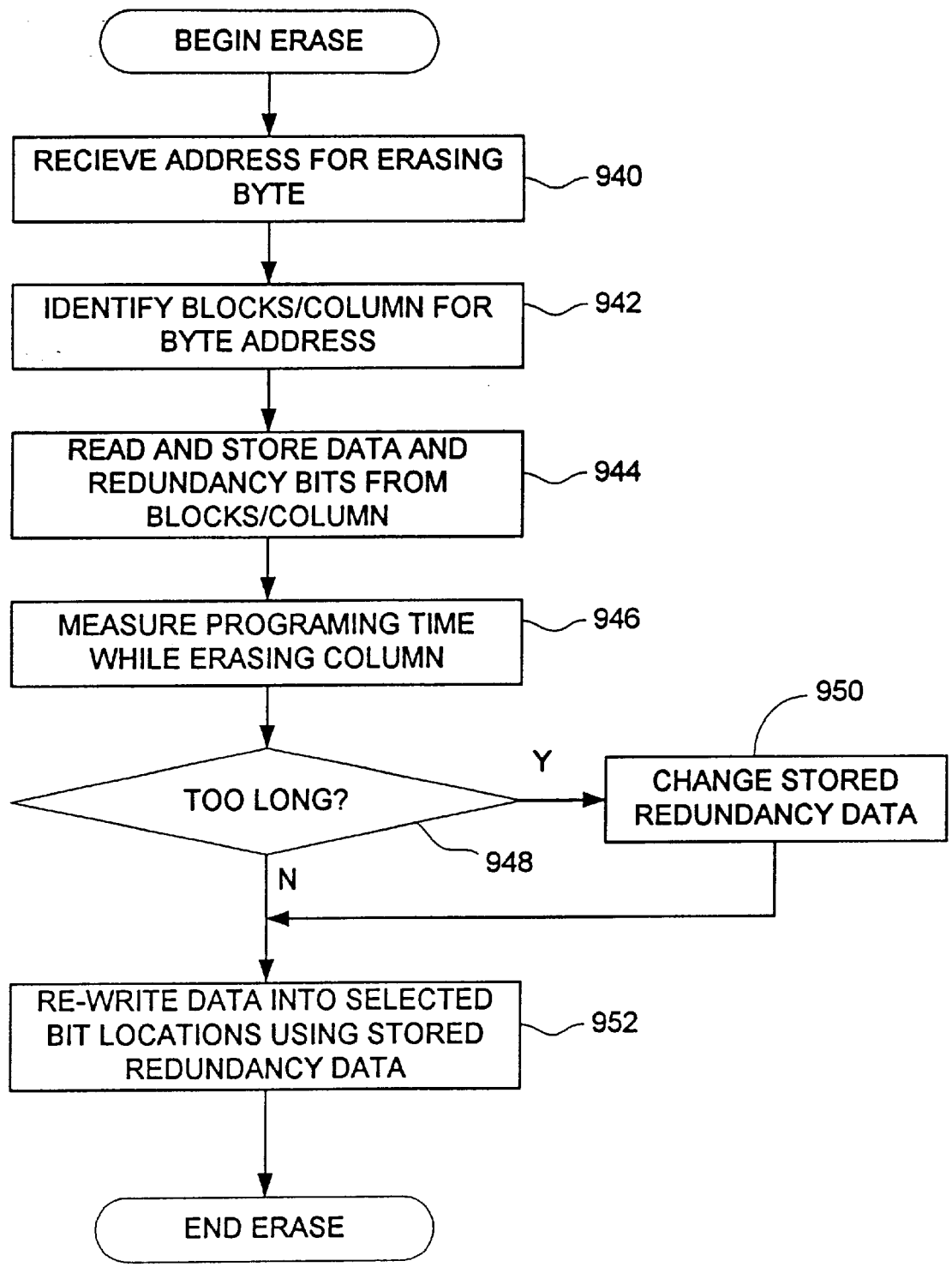

FIGS. 9(A), 9(B) and 9(C) are flow diagrams illustrating the steps utilized to read, write (program) and erase data from memory array 201 in accordance with an embodiment of the present invention.

Referring to FIG. 9(A), a read procedure begins in Step 910 where memory control circuit 205 (see FIG. 6(C)) receives a general address for a selected data byte. The general address contains information necessary to locate the bit locations containing the bit data of the selected byte, but does not include information regarding the actual charge trapping region 1–8 (see FIG. 6(A)) that is currently used to store the bit data. In step 912, the received general address data is decoded to identify the blocks/columns of the bit locations. For example, referring to FIG. 6(C), to access a byte stored in bit locations 150(1,3), the general address information is decoded to determine that the desired byte is stored in the third column of blocks 100-1 through 100-3. In step 914, this decoded information is then used to read the redundancy data stored in the supplemental memory locations associated with the columns containing the byte. For example, as shown in FIG. 8(B), column data is read from supplemental charge trapping regions A through H from blocks 100-1 through 100-3. Note that the redundancy data is always read by bringing word line $WL_S$ to 3 volts and bringing the appropriate bit line (in this case, bit line 102) to 2 volts. Therefore, the step of reading redundancy data can always be performed using the general address of the desired byte. In step 916, the redundancy data is decoded to identify the currently-used charge trapping region. As described above with respect to FIGS. 7(A) through 7(D), this process is performed by locating the position (if any) of a programmed charge trapping region and generating a specific address that is transmitted to memory control circuit 205. The specific address provides the memory control circuit 205 the necessary information regarding which of the word lines (in this example, $WL_0$–$WL_3$ and which of the bit lines must receive appropriate signals to read the bit data. With this specific address information, bit data is read in step 918 using the methods described above.

FIG. 9(B) is a flow diagram showing process steps for writing data to a selected bit location. In step 920, a group of eight associated bit locations are selected for storing the byte, and an appropriate general address is generated. As mentioned above with respect to the read procedure, this general address contains information regarding the group of four word lines and the bit lines of the selected bit locations, but does not include information regarding the currently-used charge trapping regions into which the bit data are actually written. In step 922, the blocks/columns of the target bit locations are decoded from the general address, and redundancy data is read in step 924 for the columns. In step 924, the redundancy data is used to form a specific address that is then used by the memory control circuit 205 to access the currently-used charge trapping regions of the target bit locations. Programming of the currently-used charge trapping regions is then performed in accordance with the methods described above. In step 928, accordance with an embodiment of the present invention, the amount of time required to program each of the currently-used charge trapping regions is measured and compared with a predefined programming period (operating parameter). The programming process typically entails generating an appropriate field in the target charge trapping region in brief pulses (e.g., 1 $\mu$s), and then detecting whether sufficient charge is stored to yield a logic zero output value. The predefined programming period may be, for example, 25 $\mu$s, as measured by counting the number of pulses required to perform the programming process. In, for example, conventional floating gate cells where the programming process takes longer and longer to perform as the operating performance of the cell declines, this programming period (i.e., the number of 1 $\mu$s pulses) eventually increases. The predefined programming period is arbitrarily selected as a point indicating significant decline of operational performance. If the actual programming period takes longer than the predefined programming period (Y in step 930), then control passes to step 932 where the redundancy data is updated for the columns identified in the general address. Specifically, the programmed state of the supplemental charge trapping regions is changed to indicate a new currently-used charge trapping region in the manner described above with reference to FIGS. 7(A) through 7(D). After updating the redundancy data, control is passed back to step 926. When the actual programming time is less than the predefined programming period (No in step 930), the writing process terminates.

FIG. 9(C) is a flow diagram showing an alternative embodiment in which the operating parameter used to control changes to the redundancy data is the amount of time required to erase the currently-used charge trapping regions. As disclosed in co-owned and co-pending U.S. application Ser. No. 09/244,529, entitled "EEPROM ARRAY USING 2-BIT-NON-VOLATILE MEMORY CELLS" [Attorney Docket No. TSL-001], the process of utilizing block 100 as an EEPROM requires erasing all 64 charge trapping regions (plus the two supplemental charge trapping regions) of a column each time a bit is erased in the column. The bit data (and redundancy data) that is to be retained is then re-written to the column, along with any new data for the erased bit. In accordance with the erase procedure shown in FIG. 9(C), the general address of the byte to be erased is received (Step 940) and the blocks/column associated with the byte are decoded (Step 942) as described above. The 64 data bits and the redundancy data is then read from the columns and temporarily stored (Step 944), and then the charge trapping regions of the column are subjected to erase potentials (Step 946). Similar to the programming process discussed above, erasing is performed by generating erase field pulses (e.g., 1 $\mu$s) until a logic one is measured. The actual erasing period (e.g., the number of pulses) is compared against a predefined erase period (performance parameter). In step 948, if the actual erasing period is greater than the predefined erase period, control passes to step 950, wherein the temporarily stored redundancy data is updated, and then control passes to step 952. If the actual erasing period is less than the predefined erase period, control passes directly from step 948 to step 952. In step 952, the temporarily stored redundancy data is read and used to generate specific address information for writing the temporarily stored data (and/or any new data) into the currently-used charge trapping regions (as defined by the redundancy data) of the column.

Although the write/erase procedures discussed above describe using programming and erase periods to control changes to the redundancy data, other performance parameters may also be used. For example, the number of programming/erase cycles applied to a charge trapping region may be counted, and the redundancy data may be changed when the actual number of cycles is greater than a predefined number. However, this alternative embodiment would require storing the actual number.

Figure 10:
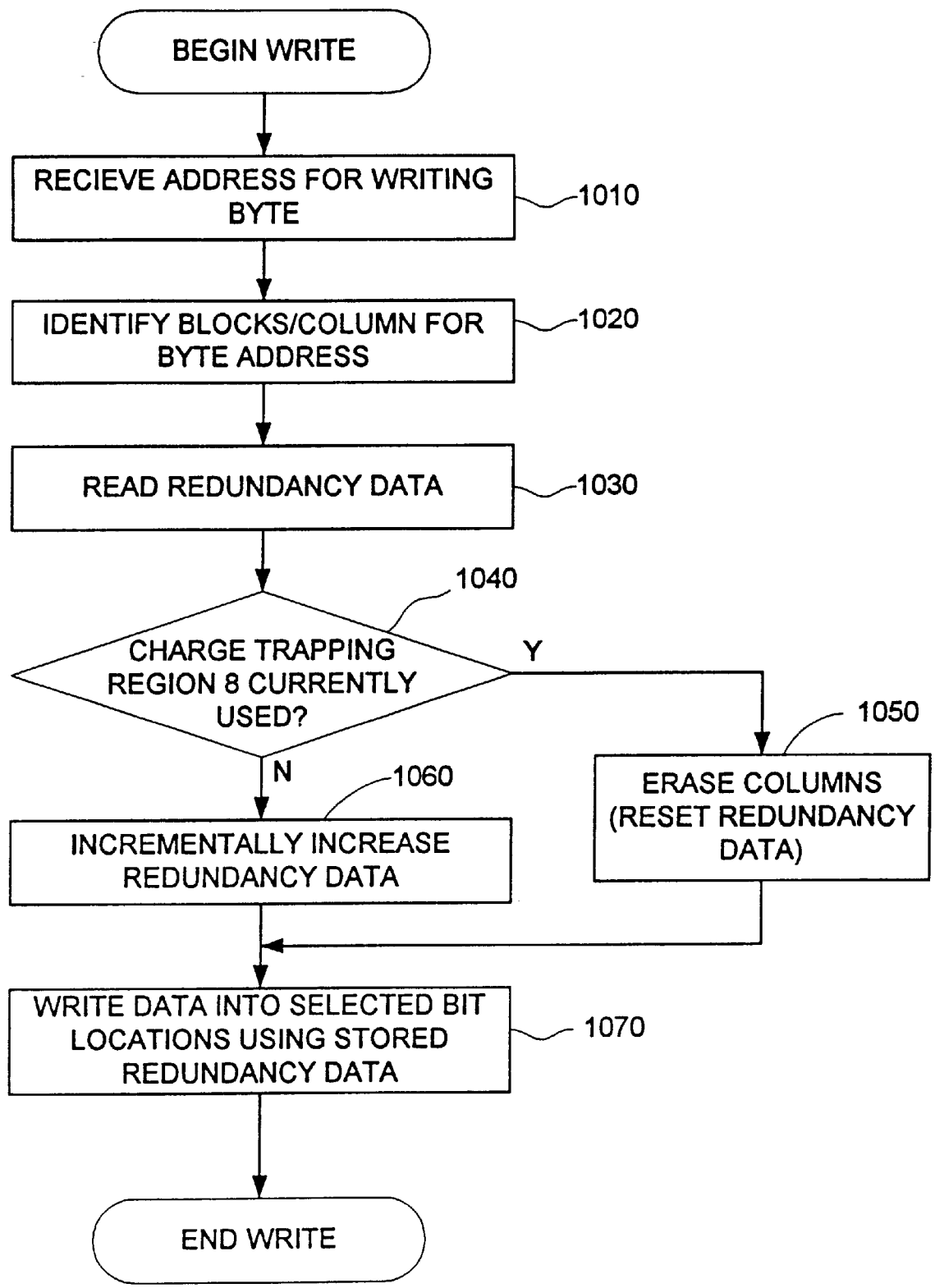
FIG. 10 is a flow diagram showing process steps for writing data in accordance with another embodiment of the present invention.

FIG. 10 is a flow diagram showing steps associated with a modified method for writing data to a bit location in accordance with another embodiment of the present invention. In accordance with the modified method, each charge storage region of a bit location is utilized before an erase process is performed. Similar to the method described above, when a command is received to write data to a particular bit location (Step 1010), the block/column of the bit location is identified (Step 1020) and the redundancy data is read (Step 1030). In accordance with the modified method, the currently-used charge trapping region is then identified from the redundancy data (Step 1040). If the currently-used charge trapping region is charge trapping region 8 (i.e., the last charge trapping region of the bit location), then all bits associated with the column are erased (Step 1050), thereby resetting the redundancy data to identify charge trapping region 1. If the charge trapping region identified in Step 1040 is any of regions 1–7, then the redundancy data is changed to identify the next sequential charge trapping region. For example, if the currently-used charge trapping region is region 2 prior to the write process, then the redundancy data is incrementally increased to identify charge trapping region 3 in Step 1060. The updated redundancy data (as changed in either Step 1050 or 1060) is then used to identify the currently-used charge trapping region, and then data is then written (Step 1070). Using the modified method, the number of erasing procedures (which are typically much longer than programming procedures) is reduced, thereby increasing the average write time. In addition, the modified method increases the operational lifetime of the memory array over embodiments that do not utilize redundancy schemes. However, the modified method limits the number of bit locations associated with each column. In addition, the modified method limits the operational lifetime of the memory array to the lifetime of the "weakest" charge trapping region.

Although the invention has been described in connection with several embodiments, it is understood that this invention is not limited to these embodiments, but is capable of various modifications that would be apparent to a person skilled in the art. For example, although the memory blocks have been described as having eight diffusion bit lines, four metal bit lines and eight select transistors, it is understood that memory blocks having different numbers of diffusion bit lines, metal bit lines and select transistors can be constructed which utilize the redundancy methods of the present invention. Moreover, although memory block 100 has been described as having 32 rows of data memory cells and one row of redundancy memory cells, it is understood that other numbers of data memory cell rows (e.g., 64) and redundancy memory cells rows can be used in other embodiments. Further, although memory array 201 has been described as storing bytes in parallel, serial memory storage is also possible using methods disclosed in co-owned and co-pending U.S. application Ser. No. 09/244,317, filed herewith, entitled "EEPROM ARRAY USING 2-BIT NON-VOLATILE MEMORY CELLS" [Attorney Docket No. TSL-003], which is incorporated herein by reference in its entirety. Thus, the invention is limited only by the following claims.

What is claimed is:

1. A redundancy method for a memory array including 2-bit memory cells forming a plurality of bit locations, each bit location including a plurality of charge trapping regions, the method comprising the steps of:

repeatedly programming a first charge trapping region of a bit location with bit data addressed to the bit location until an actual operating parameter associated with the first charge trapping region is greater than or equal to a predefined operating parameter; and programming a second charge trapping region of the bit location to store data bit addressed to the bit location.

2. The redundancy method according to claim 1, further comprising establishing the predefined operating parameter by setting a predefined erasing period, wherein the step of repeatedly programming the first charge trapping region comprises:

periodically erasing all of the plurality of charge trapping regions of the bit location such that a charge stored in the first charge trapping is erased, comparing an actual erase period required to erase charge in the first charge trapping region with the predefined erasing period, and programming the first charge trapping region until the actual erasing period is greater than or equal to the predefined erasing period.

3. The redundancy method according to claim 1, further comprising establishing the predefined operating parameter by setting a predefined programming period, wherein the step of repeatedly programming the first charge trapping region comprises comparing an actual programming period required to store a charge in the first charge trapping region with the predefined programming period, and the step of repeatedly programming the first charge trapping region is performed until the actual programming period is greater than or equal to the predefined programming period.

4. The redundancy method according to claim 1, further comprising establishing the predefined operating parameter by setting a predefined number of programming operations, and wherein the step of repeatedly programming the first charge trapping region is performed until a number of times the first charge trapping region is programmed is greater than or equal to the predefined number of programming operations.

5. A redundancy method for a memory array including 2-bit memory cells forming a plurality of bit locations, each bit location including a plurality of charge trapping regions, the method comprising the steps of:

programming a first charge trapping region of a bit location to store a first data bit;

erasing all of the charge trapping regions of the bit location, whereby the first data bit is erased from the first charge trapping region;

comparing an actual time period required to erase the first charge trapping region with a predetermined time period; and programming a second charge trapping region of the bit location to store the data bit if the actual time period is greater than the predetermined time period.

6. A memory array including 2-bit memory cells forming a plurality of bit locations, each bit location including a plurality of charge trapping regions, wherein the memory array comprises:

a memory location for storing redundancy data identifying a first charge trapping region of each bit location;

an addressing circuit for reading the memory location and for addressing the first charge trapping region of each bit location in response to the redundancy data;

a programming circuit for applying predetermined potentials to all of the charge trapping regions of each bit location such that charges are removed from the first charge trapping regions of some of the bit locations; and a comparison circuit for comparing an actual time period required to erase the first charge trapping region of one of the bit locations with a predetermined time period;

wherein the programming circuit alters the memory location such that the redundancy data identifies a second charge trapping region of each bit location if the actual time period is greater than the predetermined time period.

7. A method for reading data from a non-volatile memory array including:

a first data bit location including first and second charge trapping regions coupled to a first bit line, a first redundancy bit location including a third charge trapping region coupled to the first bit line, a second data bit location including fourth and fifth charge trapping regions coupled to a second bit line, a second redundancy bit location including a sixth charge trapping region coupled to the second bit line, wherein the method comprises the steps of:

reading redundancy data stored in the third and sixth charge trapping regions of the first and second redundancy bit locations; and identifying currently-used charge trapping regions of the first and second data bit locations based on the redundancy data, wherein the currently-used charge trapping regions are the first and fourth charge trapping regions when the third charge trapping region stores a first logic value and the sixth charge trapping region stores a second logic value, and wherein the currently-used charge trapping regions are the second and fifth charge trapping regions when the third charge trapping region stores the second logic value.

8. The method according to claim 7, wherein the first charge trapping region is part of a first 2-bit memory cell coupled to the first bit line, the second charge trapping region is part of a second 2-bit memory cell coupled to the first bit line, and the third charge trapping region is part of a third 2-bit memory cell coupled to the first bit line.

9. The method according to claim 7, further comprising the step of reading data bit values stored in the currently-used charge trapping regions identified from the redundancy data.

10. The method according to claim 7, further comprising the step of writing data bit values into the currently-used charge trapping regions identified from the redundancy data.

11. The method according to claim 10, wherein the step of writing further comprises applying an erasing field to the first, second, fourth and fifth charge trapping regions.

12. The method according to claim 7, wherein the non-volatile memory array further includes:

a third data bit location including seventh and eighth charge trapping regions coupled to the first bit line, a third redundancy bit location including a ninth charge trapping region coupled to the first bit line, a fourth data bit location including tenth and eleventh charge trapping regions coupled to the second bit line, a fourth redundancy bit location including a twelfth charge trapping region coupled to the second bit line;

wherein the method further comprises the steps of:

decoding an address signal;

if the decoded address signal addresses the third and fourth data bit locations, reading redundancy data stored in the ninth and twelfth charge trapping regions; and identifying currently-used charge trapping regions of the third and fourth data bit locations based on the redundancy data, wherein the currently-used charge trapping regions are the seventh and tenth charge trapping regions when the ninth charge trapping region stores the first logic value and the twelfth charge trapping region stores the second logic value, and wherein the currently-used charge trapping regions are the eighth and eleventh charge trapping regions when the ninth charge trapping region stores the second logic value.

13. A method for reading data from a non-volatile memory array including:

a plurality of bit lines, a plurality of data bit locations, each data bit location including a plurality of charge trapping regions coupled to an associated bit line, and a plurality of redundancy bit locations, each redundancy bit location including a charge trapping region coupled to an associated bit line, wherein the method comprising the steps of:

reading redundancy data from the charge trapping regions of the plurality of redundancy bit locations such that the redundancy data is transmitted onto the plurality of bit lines;

identifying a currently-used charge trapping region for each data bit location by identifying the position of a programmed logic value in the redundancy data; and transmitting data bits from the currently-used charge trapping regions of the plurality of data bit locations to form a byte.

14. The method according to claim 13, wherein the first charge trapping region is part of a first 2-bit memory cell coupled to the first bit line, the second charge trapping region is part of a second 2-bit memory cell coupled to the first bit line, and the third charge trapping region is part of a third 2-bit memory cell coupled to the first bit line.

15. The method according to claim 13, further comprising the step of writing data bit values into the currently-used charge trapping regions identified from the redundancy data.

* * * * *